United States Patent [19]
Siemon et al.

[11] Patent Number: 5,459,643
[45] Date of Patent: Oct. 17, 1995

[54] ELECTRICALLY ENHANCED WIRING BLOCK WITH BREAK TEST CAPABILITY

[75] Inventors: John Siemon, Woodbury; Howard Reynolds, Waterbury, both of Conn.

[73] Assignee: The Siemon Company, Watertown, Conn.

[21] Appl. No.: 343,823

[22] Filed: Nov. 22, 1994

Related U.S. Application Data

[63] Continuation of Ser. No. 130,738, Sep. 30, 1993, Pat. No. 5,392,195.

[51] Int. Cl.⁶ ................................................. H01R 23/68
[52] U.S. Cl. .................... 361/785; 361/752; 361/796; 361/748; 439/92; 439/101; 439/57; 439/79
[58] Field of Search ............................. 361/747, 748, 361/752, 759, 789, 796, 802, 803; 439/680, 709, 712, 715, 92, 101, 108, 59, 62, 65, 79, 637, 636; 174/17 R, 52.4

[56] References Cited

U.S. PATENT DOCUMENTS

| 179,996 | 4/1957 | Wells et al. . |
| 179,997 | 4/1957 | Wells et al. . |

(List continued on next page.)

FOREIGN PATENT DOCUMENTS

| 2089122 | 6/1982 | European Pat. Off. . |
| 2233157A | 1/1991 | European Pat. Off. . |
| 0567016A2 | 10/1993 | European Pat. Off. . |
| 6939619 | 11/1969 | France . |
| 1449209 | 12/1973 | France . |
| 678914 | 6/1939 | Germany . |
| 1965 | 1/1980 | Germany . |
| 3605063 | 2/1986 | Germany . |
| 2-91957 | 3/1990 | Japan . |
| 2-268484 | 11/1990 | Japan . |
| 1432793 | 4/1976 | United Kingdom . |
| 2060266 | 10/1979 | United Kingdom . |
| 0292830 | 1/1982 | United Kingdom . |
| 0134899 | 8/1985 | United Kingdom . |
| 0278485 | 8/1988 | United Kingdom . |
| 0278484 | 8/1988 | United Kingdom . |
| 279405 | 8/1988 | United Kingdom . |
| WO92/04798 | 3/1992 | WIPO . |

OTHER PUBLICATIONS

AT&T Document Development Organization, 110T–Type Terminal Block Installation, May 1, 1991.

(List continued on next page.)

*Primary Examiner*—Leo P. Picard
*Assistant Examiner*—Y. Whang
*Attorney, Agent, or Firm*—Fishman, Dionne & Cantor

[57] ABSTRACT

An electrically enhanced wiring block with break test capability employs a printed circuit board which includes integrally defined transmission lines and capacitive elements designed to improve impedance characteristics and electrical balance between interconnected wiring and connecting strips and thereby optimize its transmission performance. The transmission lines consist of impedance controlled circuitry with integral capacitive elements that are provided by means of a novel use of plated through holes. The holes may be sized, spaced and interconnected in various configurations to generate the desired capacitance. Two rows of connecting blocks with a row of connecting strips therebetween are mounted to one side of the circuit board preferably by solderless connectors and are interconnected by circuitry on the circuit board. The capacitive elements are connected between selected leads of the connecting blocks and connecting strips by the impedance controlled circuitry. The circuit board is mounted onto a bracket which is itself mounted onto a wiring block base. A series of disconnect plugs are provided for breaking electrical connection between selected connecting block positions by separating contacts with selected connecting strip positions. Also, a series of modular jack test assemblies are provided for testing and at other times when modular jack connection is desired. The modular jack test assembly comprises a modular jack mounted on a circuit board having edge contacts for mating with the contacts of the connecting strip.

14 Claims, 28 Drawing Sheets

U.S. PATENT DOCUMENTS

| | | |
|---|---|---|
| 212,330 | 10/1968 | Teagno et al. . |
| 233,729 | 11/1974 | De Forrest . |
| 240,631 | 7/1976 | Lang et al. . |
| 248,096 | 6/1978 | Stupay . |
| 269,426 | 7/1983 | Pyle . |
| 276,605 | 12/1984 | Neuwirth . |
| 298,826 | 12/1988 | Nakajo et al. . |
| 300,739 | 4/1989 | Kikuta . |
| 306,716 | 3/1990 | Shimirak . |
| 333,656 | 3/1993 | Bluemel et al. . |
| 969,409 | 9/1910 | Russell . |
| 1,278,339 | 9/1918 | Hastings et al. . |
| 1,432,793 | 5/1973 | Gandrud . |
| 1,627,206 | 6/1926 | Setzepfand . |
| 1,799,188 | 4/1931 | Weaver . |
| 1,922,138 | 12/1931 | Nyquist . |
| 1,995,454 | 10/1933 | Hunter . |
| 2,244,937 | 11/1939 | Brainard . |
| 2,667,543 | 4/1951 | Smith et al. . |
| 3,343,041 | 4/1966 | Pistey et al. . |
| 3,496,555 | 8/1965 | Jones et al. . |
| 3,579,046 | 5/1971 | Edwards . |
| 3,591,834 | 7/1971 | Kollas . |
| 3,634,806 | 1/1972 | Ferguson . |
| 3,641,472 | 9/1970 | Phillips, Jr. . |
| 3,662,117 | 5/1972 | Bhatt et al. . |
| 3,701,838 | 10/1972 | Olney, Jr. . |
| 3,744,009 | 7/1973 | Teagno et al. . |
| 3,757,028 | 9/1973 | Schlessel . |
| 3,761,842 | 9/1973 | Gandrud . |
| 3,802,925 | 7/1975 | Fisk et al. . |
| 3,891,815 | 6/1975 | Hiele . |
| 4,027,937 | 6/1977 | Norden . |
| 4,049,227 | 9/1977 | Georgopulos . |
| 4,053,719 | 10/1977 | Debortoli et al. . |
| 4,144,509 | 3/1979 | Boutros . |
| 4,241,974 | 12/1980 | Hardesty . |
| 4,367,908 | 1/1983 | Johnston . |
| 4,413,469 | 11/1983 | Paquin . |
| 4,418,239 | 11/1983 | Larson et al. . |
| 4,489,419 | 12/1984 | Wang . |
| 4,547,034 | 10/1985 | Forberg et al. . |
| 4,600,256 | 7/1986 | Anttila . |
| 4,605,115 | 9/1987 | Tolend . |
| 4,615,576 | 10/1986 | Gerke et al. . |
| 4,636,918 | 1/1987 | Jndoin . |
| 4,641,900 | 2/1987 | Japngie . |
| 4,643,509 | 2/1987 | Hollyday et al. . |
| 4,657,323 | 4/1987 | Erbe . |
| 4,660,041 | 5/1987 | LaKomski et al. . |
| 4,669,802 | 6/1987 | Schaffer . |
| 4,676,576 | 6/1987 | Feldberg et al. . |
| 4,678,251 | 7/1987 | Willard . |
| 4,682,129 | 7/1987 | Bakermans et al. . |
| 4,689,441 | 8/1987 | Dick et al. . |
| 4,690,479 | 9/1987 | Hollyday et al. . |
| 4,701,135 | 10/1987 | Volk et al. . |
| 4,714,440 | 12/1987 | Hutchins . |
| 4,726,776 | 2/1988 | Billman et al. . |
| 4,726,790 | 2/1988 | Hadiis . |
| 4,747,020 | 5/1988 | Brickley et al. . |
| 4,756,695 | 7/1988 | Lane et al. . |
| 4,781,624 | 11/1988 | Shepherd . |
| 4,791,391 | 12/1988 | Linnell et al. . |
| 4,799,901 | 1/1989 | Pirc . |
| 4,813,071 | 3/1989 | De Luca . |
| 4,815,127 | 3/1989 | Sato et al. . |
| 4,820,192 | 4/1989 | Denkmann et al. . |
| 4,824,383 | 4/1989 | Lemke . |
| 4,831,497 | 5/1989 | Webster et al. . |
| 4,846,735 | 7/1989 | Terchler et al. ............ 439/709 |
| 4,850,887 | 7/1989 | Sugawara . |
| 4,853,659 | 8/1989 | Klina . |
| 4,865,564 | 9/1989 | Denkmann et al. . |
| 4,869,682 | 9/1989 | Volk et al. . |
| 4,871,316 | 10/1989 | Herrell et al. . |
| 4,874,904 | 10/1989 | DeSanti . |
| 4,875,205 | 10/1980 | Hugno . |
| 4,875,875 | 10/1989 | Archer et al. . |
| 4,878,848 | 11/1989 | Ingolshe . |
| 4,883,432 | 11/1989 | Reed . |
| 4,905,275 | 2/1990 | Meyerhoefer et al. . |
| 4,909,757 | 3/1990 | Reed . |
| 4,912,452 | 3/1990 | Koleyni . |
| 4,912,552 | 3/1990 | Aimson, III et al. . |
| 4,929,196 | 5/1990 | Ponn et al. . |
| 4,930,200 | 6/1990 | Brush, Jr. et al. . |
| 4,931,754 | 6/1990 | Moussie . |
| 4,932,892 | 6/1990 | Hatch . |
| 4,939,624 | 7/1990 | August et al. . |
| 4,950,840 | 8/1990 | Zetena . |
| 4,953,206 | 8/1990 | Friesen et al . |
| 4,958,262 | 9/1990 | Wilkie, Jr. . |
| 4,975,078 | 12/1990 | Stroede et al. . |
| 4,986,768 | 1/1991 | Brankamp et al. ............ 439/608 |
| 4,992,061 | 2/1991 | Brush, Jr. et al. . |
| 5,024,609 | 6/1991 | Piorunneek ............ 439/637 |
| 5,026,292 | 6/1991 | Pickles et al. ............ 439/108 |
| 5,029,270 | 7/1991 | Shiraishi et al. . |
| 5,032,991 | 7/1991 | Davidson et al. . |
| 5,039,824 | 8/1991 | Takashima et al. . |
| 5,041,018 | 8/1991 | Arnett . |
| 5,044,979 | 9/1991 | Siemon et al. . |
| 5,046,960 | 9/1991 | Fedder ............ 439/108 |
| 5,046,968 | 9/1991 | Baur et al. . |
| 5,061,209 | 10/1991 | Bolick, Jr. et al. . |
| 5,068,631 | 11/1991 | Vince . |
| 5,069,641 | 1/1991 | Sakamoto et al. . |
| 5,074,801 | 2/1991 | Sieman . |
| 5,082,457 | 1/1992 | Wollscheidt et al. . |
| 5,086,271 | 2/1992 | Haill et al. . |
| 5,088,939 | 2/1992 | Shepherd . |
| 5,091,826 | 2/1992 | Arnett et al. . |
| 5,093,879 | 3/1992 | Breeman et al. . |
| 5,125,852 | 6/1992 | Archer . |
| 5,139,442 | 8/1992 | Sakomato et al. . |
| 5,145,401 | 9/1992 | Archer . |
| 5,145,413 | 9/1992 | Okamoto et al. . |
| 5,149,277 | 9/1992 | LeMaster . |
| 5,153,988 | 10/1992 | Mattis et al. . |
| 5,160,273 | 11/1992 | Carney . |
| 5,178,554 | 1/1993 | Siemon et al. . |
| 5,186,647 | 2/1993 | Denkmann et al. . |
| 5,192,230 | 3/1993 | Gabany et al. . |
| 5,205,762 | 4/1993 | Carney . |
| 5,244,417 | 9/1993 | Perretta et al. . |
| 5,269,708 | 12/1993 | Deyoung et al. . |
| 5,299,956 | 4/1994 | Brownell et al. . |
| 5,310,363 | 5/1994 | Brownell et al. . |

OTHER PUBLICATIONS

AT&T Network Sys., 1100 Modular Jack Panel–1991.

Ortronics. A Striking Breakthrough In Category 5 Modular Patching.

Superior Modular Products, Inc., 100 Megabit Station Outlets.

Fully Category 5 Complaint, The Future Is Now: Mod–Tap High Performance–Jan. 1993.

Porta Systems Corp.; If there were a category 6, . . . , The Effects of Multiple Connectors–Feb. 1993.

Krone literature, Solutions For Every Application.

Northern Telecom. BLK IDC Distribution Connector, 25–pair OCBIX1A Type–Jul. 1992.

Northern Telecom, BLX Patch Panel Wall Mount Cross–Connect System–Jul. 1992.

Northern Telecom, BIX DVO Data/Voice Outlet One 3 Type, Jul. 1992.

Northern Telecom, BIX Modular Patch Panel Rack Mount, QPBIX Type, Jul. 1992.

U.S. Army Document–1956.

Post Master General Department–Australia 1950 Long–Line Equipment UK–Line & customer Apparatus 1.

Post Master General Department–Australia 1951 Long–Line Equipment.

Siemens Publication from UK.

Ortronics 1993–1994 Product Guide Issue.

IBM Technical Disclosure Bulletin, vol. 18, No. 3 Aug. 1975.

Prediction of Crosstalk Involving Twisted Pairs of Wires–Part 1 A Transmission–Line Model for Twisted–Wire Pairs, 1979 IEEE.

Prediction of Crosstalk Involving Twisted Pairs of Wires–Part II: A Simplified Low–Frequency Prediction Model.

IEEE 1990 International Symposium on Electromagnetic Compatibility Symposium Record IBM Technical Disclosure Bulletin, vol. 18, No. 5 Oct. 1975.

Chapter 32 Noise and Crosstalk

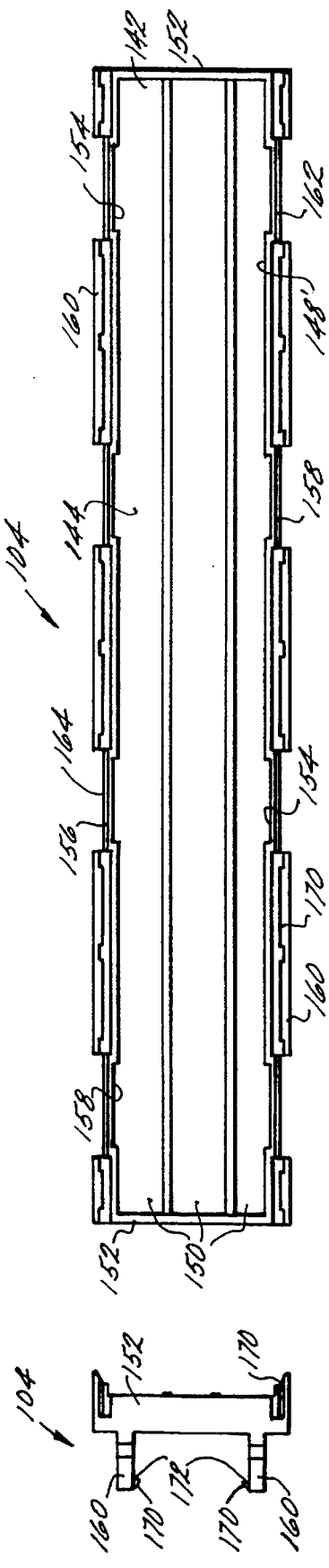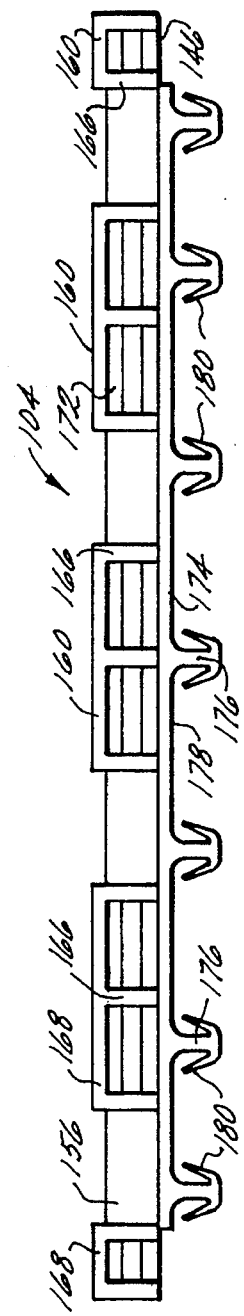

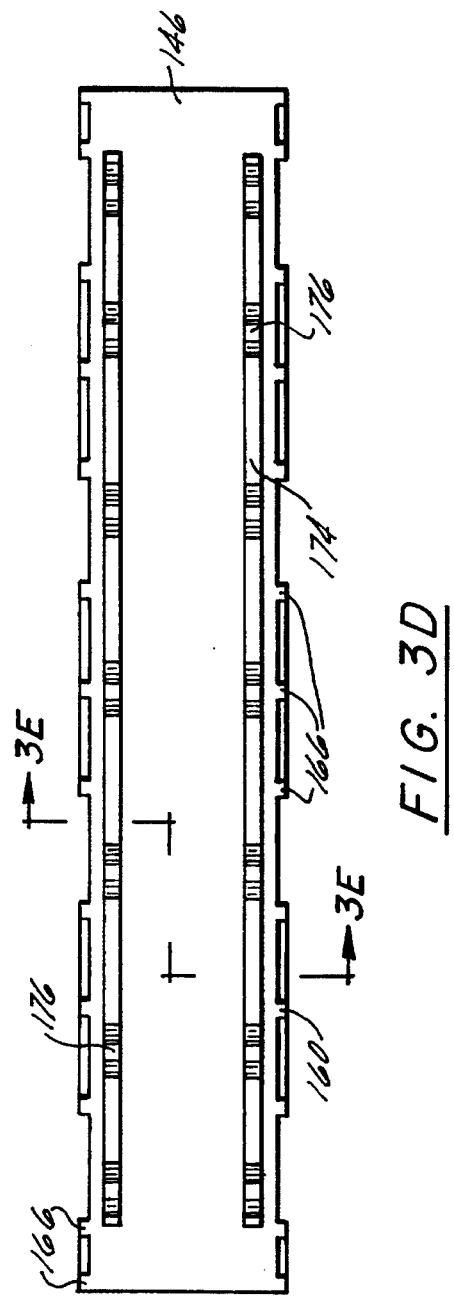
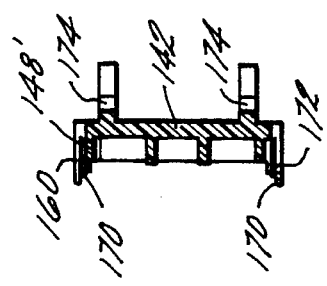
FIG. 3D
FIG. 3E

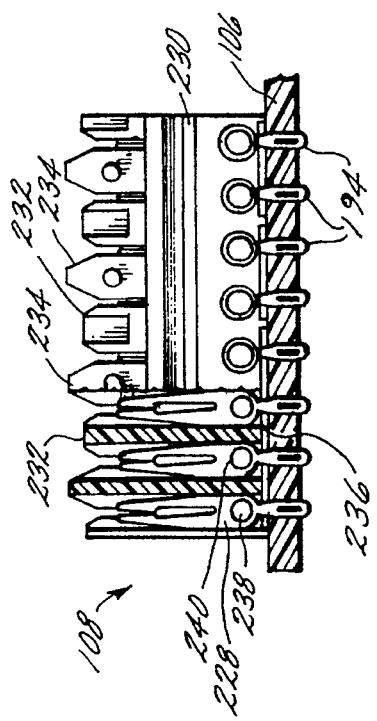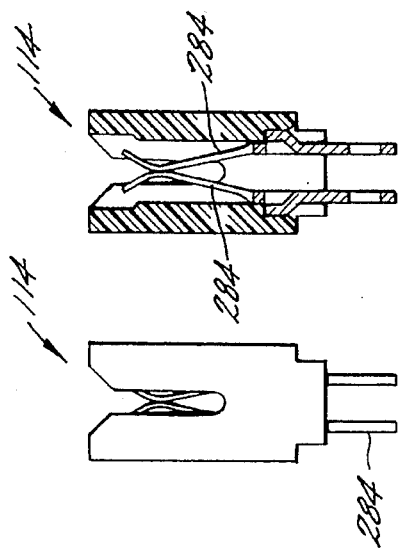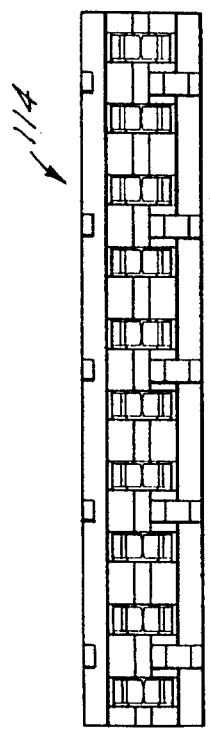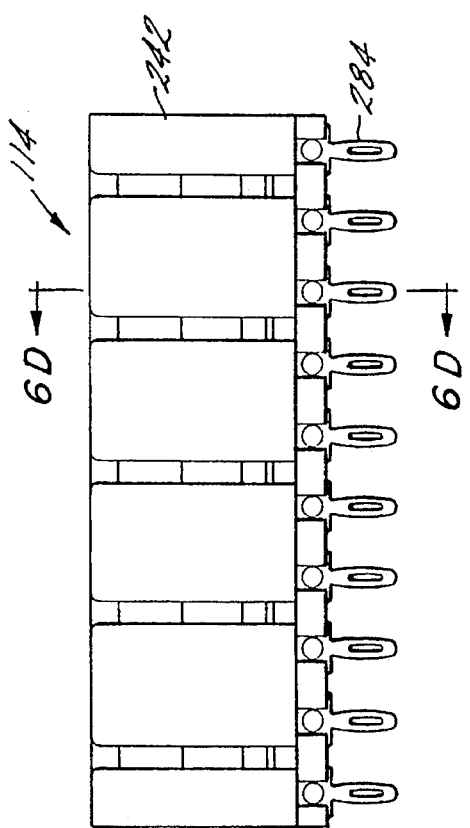
FIG. 5
FIG. 6C
FIG. 6D
FIG. 6B
FIG. 6A

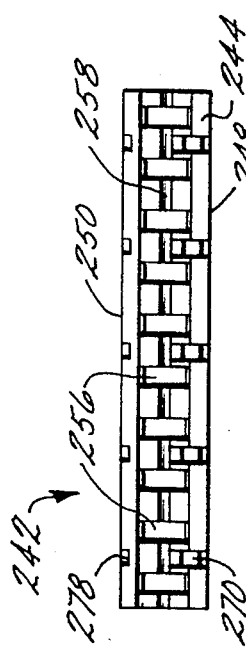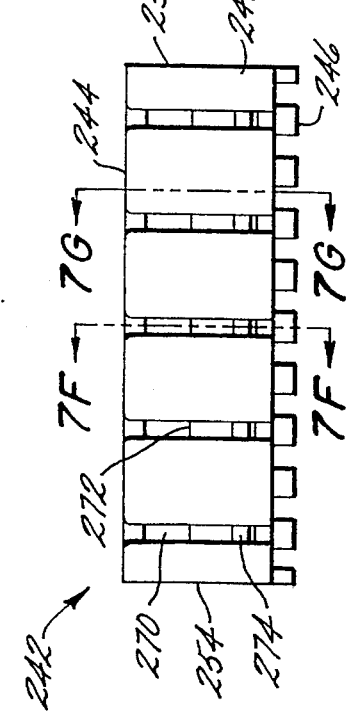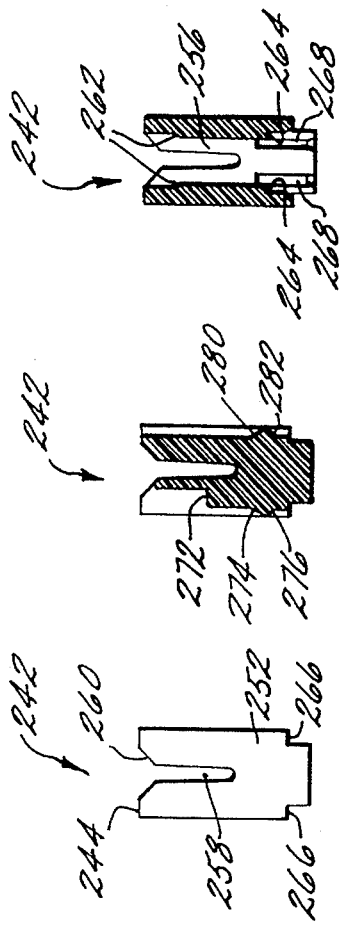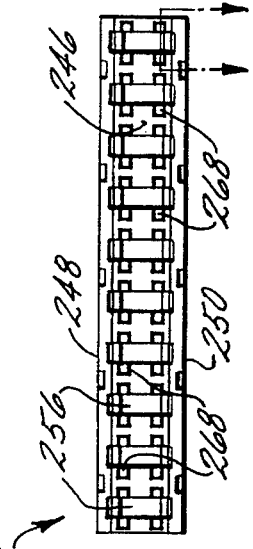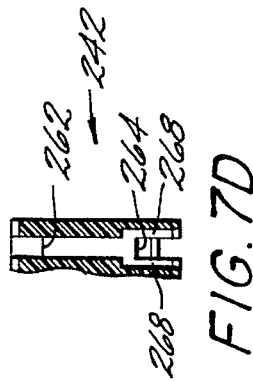

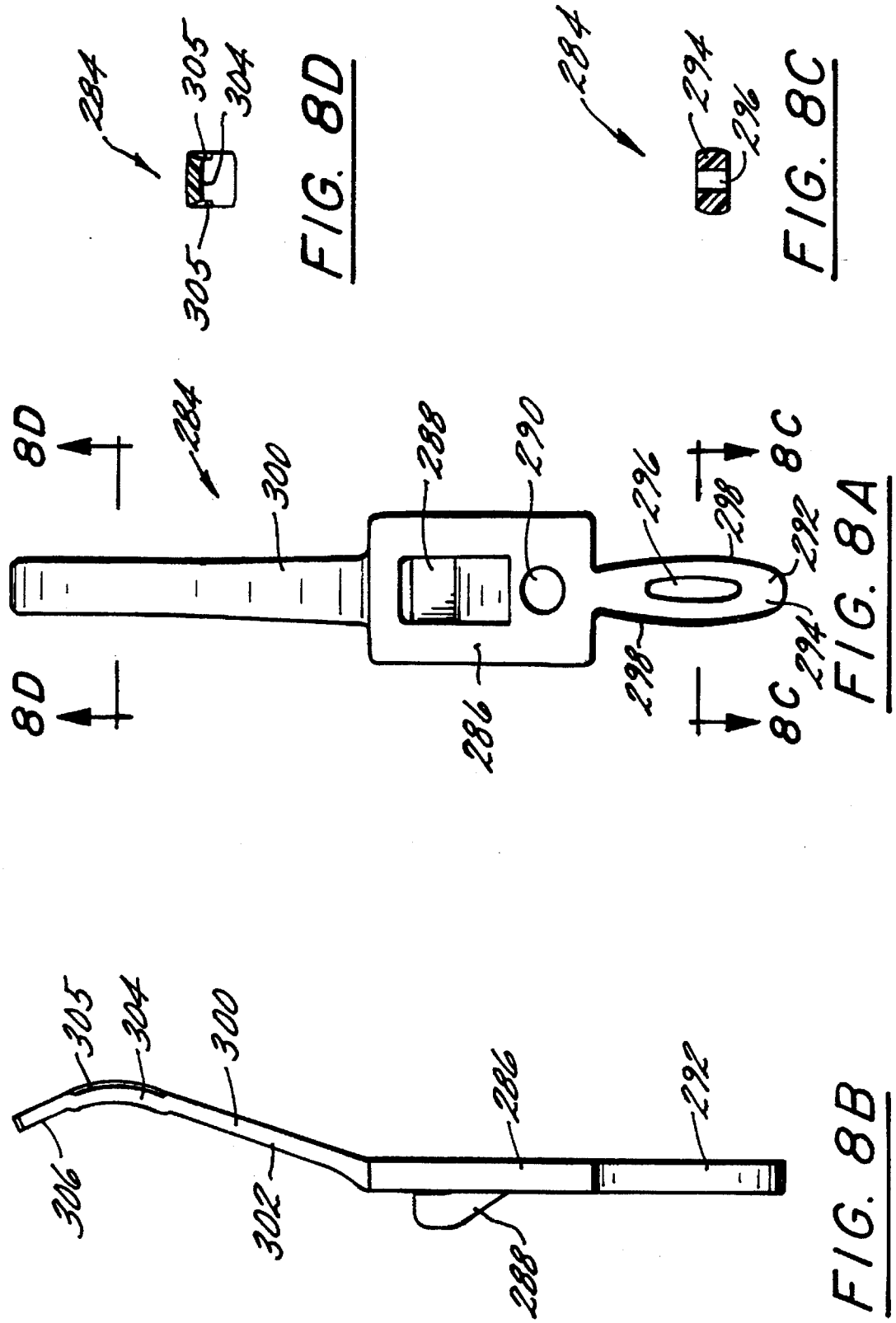

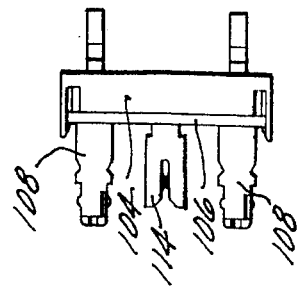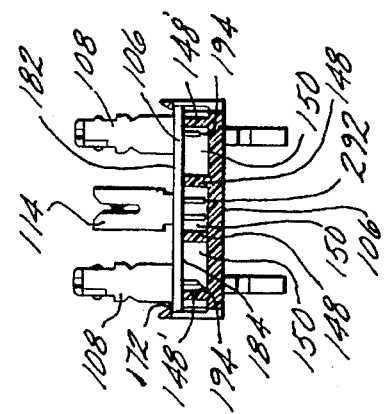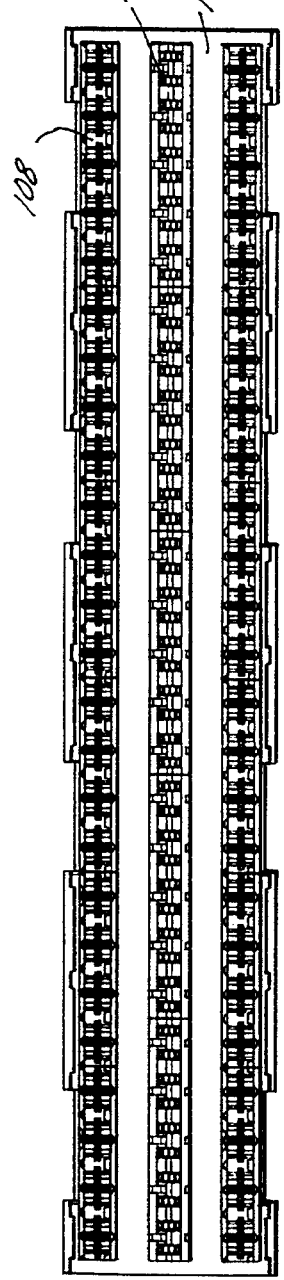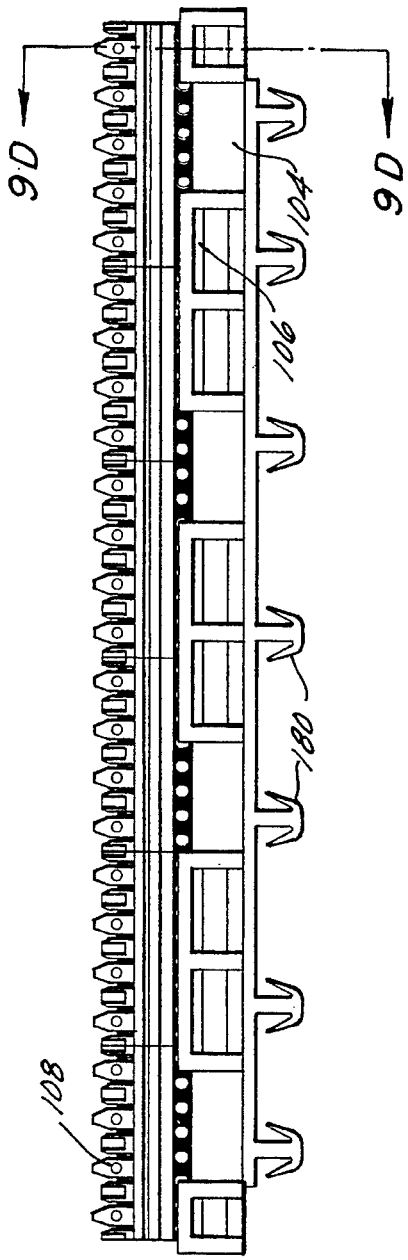

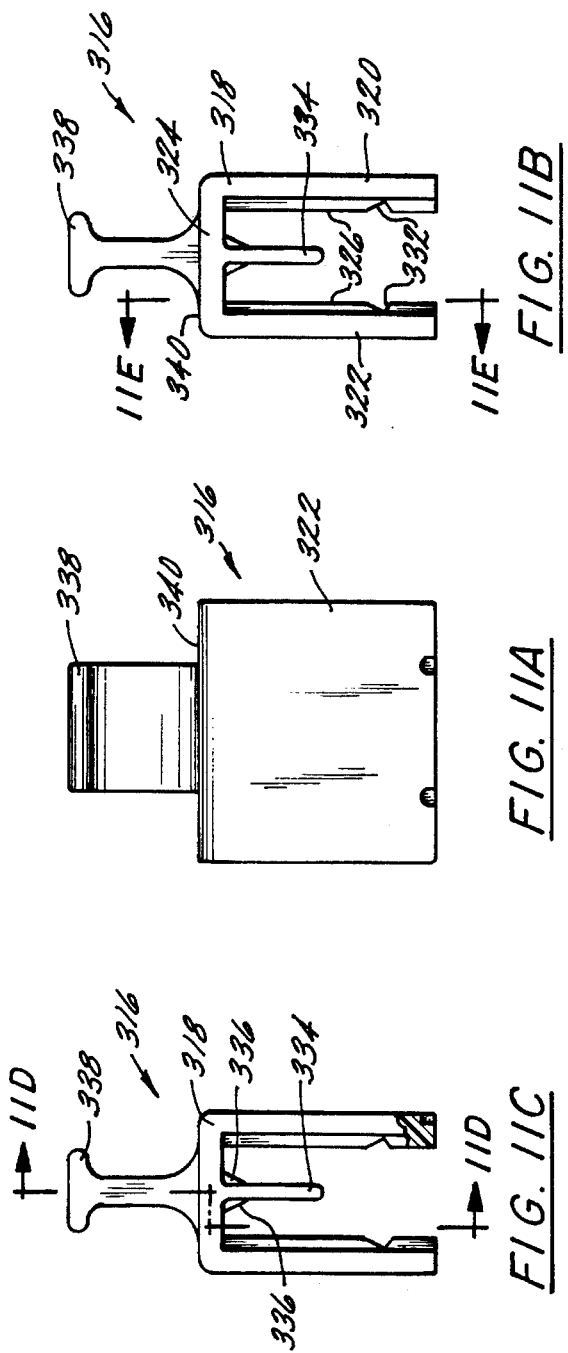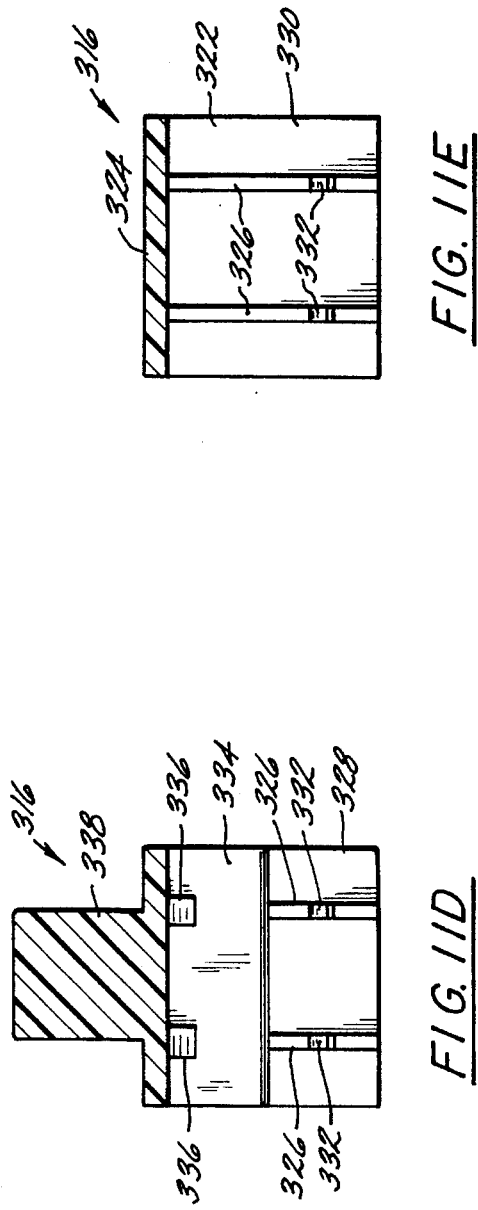

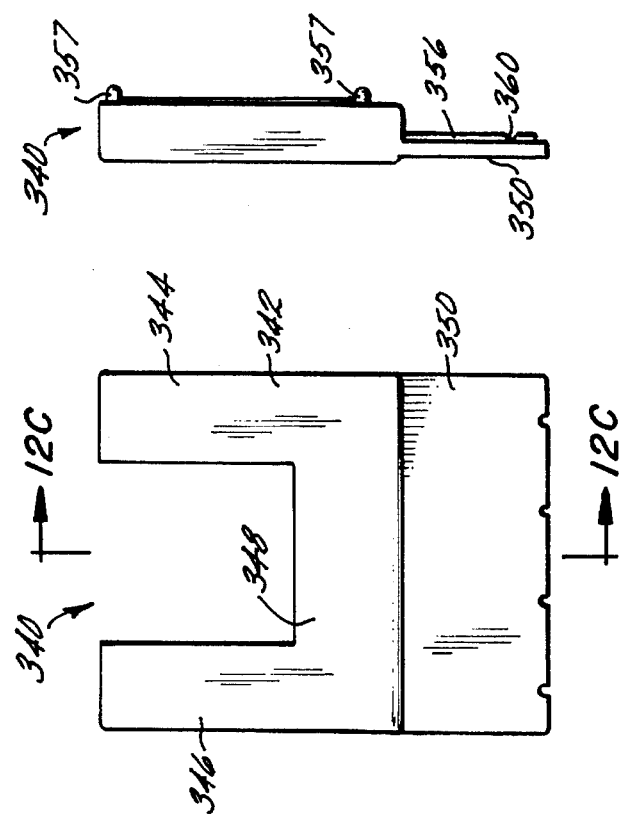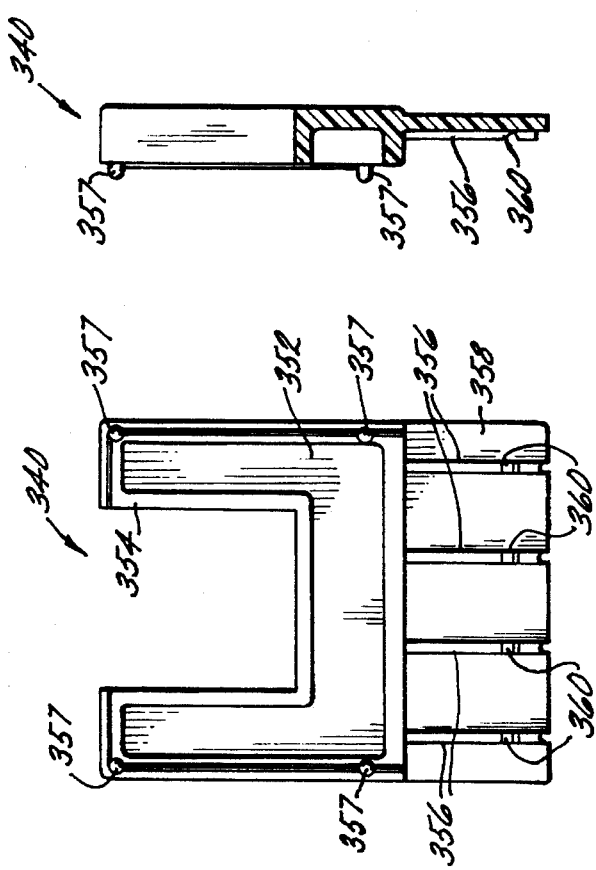

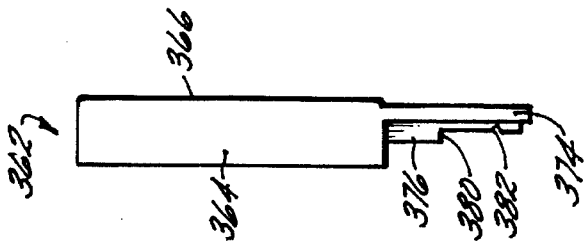
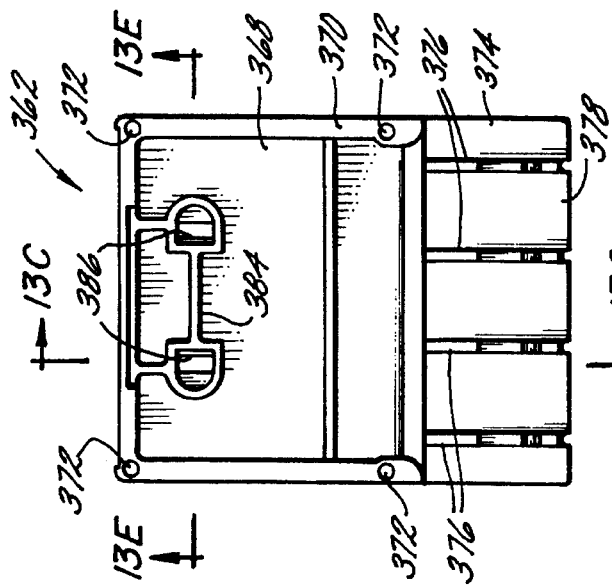
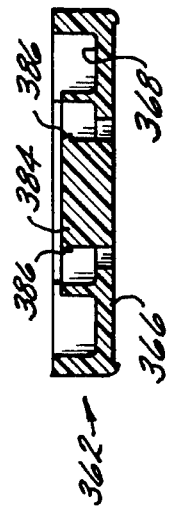
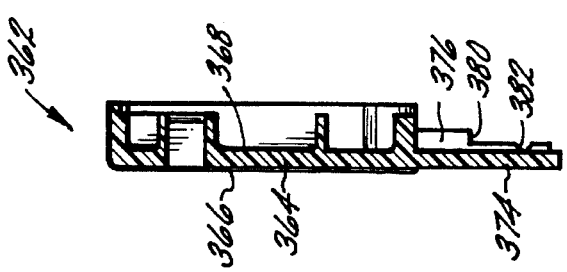
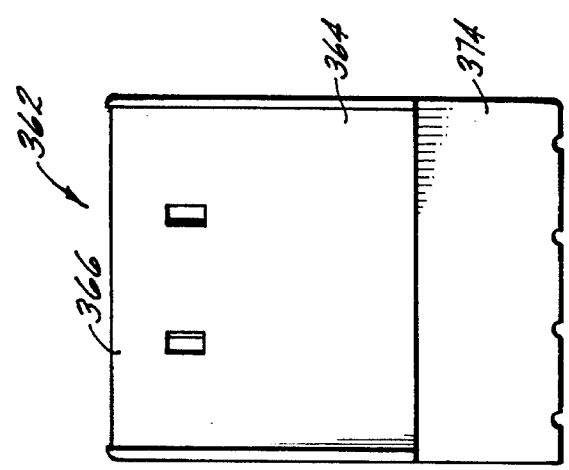

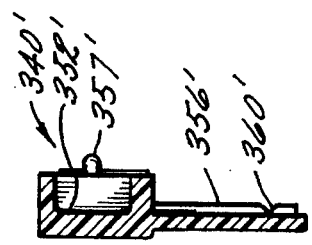
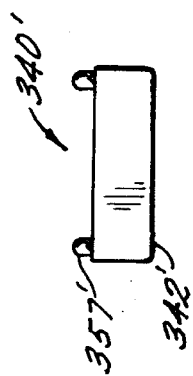
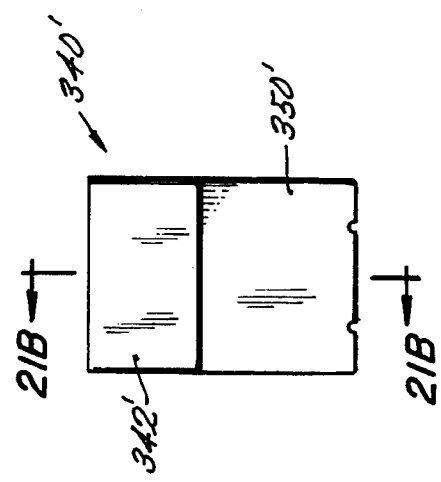
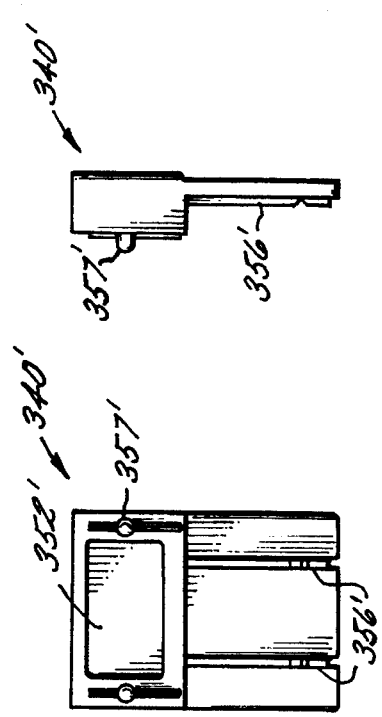

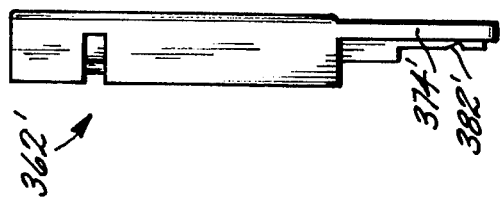
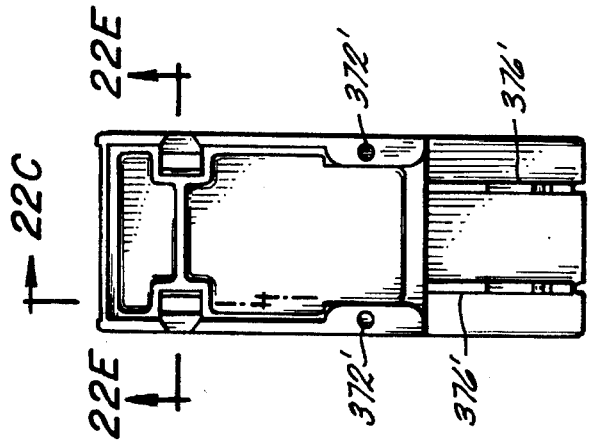
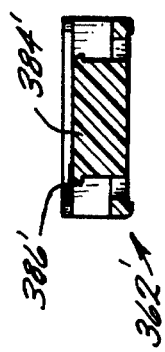
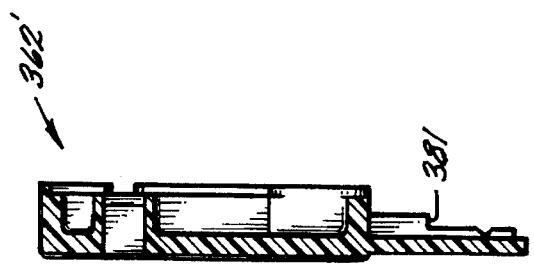
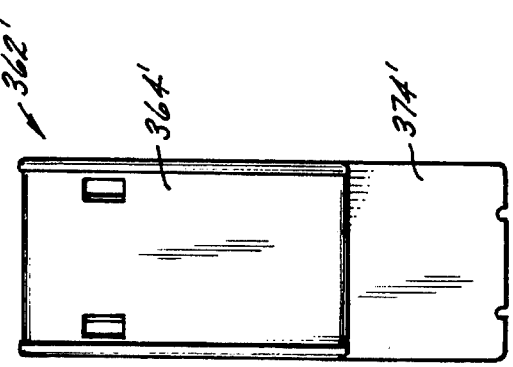

ELECTRICALLY ENHANCED WIRING BLOCK WITH BREAK TEST CAPABILITY

This is a continuation of copending application Ser. No. 08/130,738 filed on Sep. 30, 1993 U.S. Pat. No. 5,392,195.

BACKGROUND OF THE INVENTION

This invention relates to wiring blocks for use primarily in the communications industry. More specifically, this invention relates to an impedance controlled and electrically balanced wiring block assembly.

Communication system and/or network efficiency is directly dependent upon the integrity of the connector scheme employed. Such connector schemes include, for example, standard interfaces for equipment/user access (outlet connector), transmission means (horizontal and backbone cabling), and administration/distribution points (cross-connect and patching facilities). Regardless of the type or capabilities of the transmission media used for an installation, the integrity of the wiring infrastructure is only as good as the performance of the individual components that bind it together.

By way of example, a non-standard connector or pair scheme may require that work area outlets be rewired to accommodate a group move, system change, or an installation with connecting hardware whose installed transmission characteristics are compatible with an existing application but are later found to have inadequate performance when the system is expanded or upgraded to higher transmission rates. Accordingly, connecting hardware without properly qualified design and transmission capabilities, can drain user productivity, compromise system performance and pose a significant barrier to new and emerging applications.

Reliability, connection integrity and durability are also important considerations, since wiring life cycles typically span periods of ten to twenty years. In order to properly address specifications for, and performance of telecommunications connecting hardware, it is preferred to establish a meaningful and accessible point of reference. The primary reference, considered by many to be the international benchmark for commercially based telecommunications components and installations, is standard ANSI/EIA/TIA-568 (TIA-568) Commercial Building Telecommunications Wiring Standard. A supplement Technical Systems Bulletin to TIA-568 is TIA/EIA TSB40 (TSB40), Additional Transmission Specifications for Unshielded Twisted-Pair Connecting Hardware. Among the many aspects of telecommunications cabling covered by these standards are connecting hardware design, reliability and transmission performance. Accordingly, the industry has established a common set of test methods and pass/fail criteria on which performance claims and comparative data may be based.

To determine connecting hardware performance in a data environment, it is preferred to establish test methods and pass/fail criteria that are relevant to a broad range of applications and connector types. Since the relationship between megabits and megahertz depends on the encoding scheme used, performance claims for wiring components that specify bit rates without providing reference to an industry standard or encoding scheme are of little value. Therefore, it is in the interest of both manufacturers and end users to standardize performance information across a wide range of applications. For this reason, application independent standards, such as TIA-568 and TSB40, specify performance criteria in terms of hertz rather than bits per second. This information may then be applied to determine if requirements for specific applications are complied with. For example, many of the performance requirements in the IEEE 802.3i(10BASE-T) standard are specified in megahertz (MHz), and although data is transmitted at 10 Mbps for this application, test "frequencies" are specified in the standard (as high as 15 MHz).

Transmission parameters defined in TSB40 for unshielded twisted pair (UTP) connectors include attenuation and near-end crosstalk (NEXT) and return loss.

Connector attenuation is a measure of the signal power loss through a connector at various frequencies. It is expressed in decibels as a positive, frequency dependent value. The lower the attenuation value, the better the attenuation performance. Since connecting hardware is generally considered to be electrically short relative to the length of cabling between two active devices (i.e., up to 100 meters of cable is typically allowed), the attenuation performance of the connecting hardware is usually not a major performance consideration.

Connector crosstalk is a measure of signal coupling from one pair to another within a connector at various frequencies. Since crosstalk coupling is greatest between transmission segments close to the signal source, near-end crosstalk (as opposed to far-end) is generally considered to be the worst case. Although measured values are negative, near-end crosstalk (NEXT) loss is expressed in decibels as a frequency dependent value. The higher the NEXT loss magnitude, the better the crosstalk performance.

Connector return loss is a measure of the degree of impedance matching between the cable and connector. When impedance discontinues exist, signal reflections result. These reflections may be measured and expressed in terms of return loss. This parameter is also expressed in decibels as a frequency dependent value. The higher the return loss magnitude, the better the return loss performance.

Since most high speed transmission applications that are designed for use with twisted-pair cabling do not operate in a full duplex mode (i.e., transmit and receive signals are not carried over the same pair), the effects of signal reflections, as caused by connectors, are generally not significant with respect to the ability of the twisted pair cabling to support existing applications that are designed for use with twisted pair cabling. However, for future high speed applications that may employ full duplex transmission, connector return loss poses a significant limitation unless properly controlled.

The net effect of these parameters on channel performance may be expressed in signal-to-noise ratio (SNR). For connecting hardware, the parameter that has been found to have the greatest impact on SNR is near-end crosstalk.

Several industry standards specify multiple performance levels of UTP cabling components have been established. For example, Category 3, 4 and 5 cable and connecting hardware are specified in EIA/TIA TSB-36 & TIA/EIA TSB40 respectively. In these specifications, transmission requirements for Category 3 components are specified up to 16 MHz. They will typically support UTP voice and IEEE 802 series data applications with transmission rates up to 10 Mbps, such as 4 MBps Token Ring and 10BASE-T.

Transmission requirements for Category 4 components are specified up to 20 MHz. They will typically support UTP voice and IEEE 802 series data applications with transmission rates up to 16 Mbps, such as Token Ring.

Transmission requirements for Category 5 components are specified up to 100 MHz. They are expected to support UTP voice as well as emerging video and ANSI X3T9 series data applications with transmission rates up to 100 Mbps, such as 100 Mbps Twisted-Pair Physical Media Dependent (TP-PMD) and 155 Mbps asynchronous transfer for mode (ATM) applications.

In order for a UTP connector to be qualified for a given performance category, it must meet all applicable transmission requirements regardless of design or intended use. The challenge of meeting transmission criteria is compounded by the fact that connector categories apply to worst case performance. For example, a work area outlet that meets Category 5 NEXT requirements for all combinations of pairs except one, which meets Category 3, may only be classified as a Category 3 connector (provided that it meets all other applicable requirements).

Wiring/connector blocks with circuit interrupt capability, sometimes referred to as "break-test" capability, are well known. For example, such products are described in U.S. Pat. Nos. 5,044,979; 4,547,034 and 4,615,576. These patents describe wiring/connector blocks having two rows of wire termination connectors that are separated by an optional connector for providing interruptable electrical connections between the two rows of wire termination connectors. An important limitation of these prior art blocks is that the spatial alignment of the adjacent contacts allows crosstalk coupling to occur within the connector between the input and output terminations.

The regular clip spacing causes uniform capacitive coupling between adjacent rows of clips such that, when used with twisted-pair wires, the "tip" and "ring" wires that constitute a pair (balanced transmission line) is equal to that of adjacent conductors from different pairs. Since the crosstalk performance is determined by the degree of capacitive imbalance between pairs (i. e., the difference in capacitive coupling between each conductor of a pair and a conductor of another pair), the constant spacing between rows poses a limitation in terms of crosstalk performance between adjacent circuits. The extent of this limitation is manifested in terms of transmission performance. Transmission tests of these products show that they do not satisfy Category 5 requirements. Therefore, their ability to support high speed signaling applications is limited to those supported by cabling systems of Category 4 or less.

AT&T Technologies 110T-series terminal block employs two rows of known 100C series connecting blocks with its bottom insulation displacement terminals connected to bent tail leads that extend from contacts positioned between the two rows of 110C connectors. These contacts are positioned and housed to provide a circuit interrupt capability. As with the devices described in U.S. Pat. Nos. 5,044,979; 4,547,034 and 4,615,576, the regular contact spacing and significant electrical length of this product have the effect of limiting transmission performance, and hence its ability to support advanced networking applications. In this case, transmission performance is limited to Category 4.

U.S. Pat. No. 5,160,273 discloses a "break-test" device which employs positioned shielding to improve crosstalk isolation between pairs. Although this design provides a benefit in terms of improved crosstalk performance over the above discussed prior art devices, it is bereft with other limitations such as the by additional expense of the shield element and numerous additional secondary operations required to assemble the finished product. The shield also raises the risk of compromising electrical isolation between signal carriers.

Prior art methods also exist for achieving electrical balance between pairs to improve crosstalk performance of other types of connectors used with balancing cabling. In particular, U.S. patent application Ser. No. 07/993,480 filed Dec. 18, 1992 discloses an electrically balanced connector assembly for modular jack outlet connectors. However, modular jack outlet connectors do not require internal "break-test" capability. Heretofore wiring blocks have not offered compensation means to achieve electrical balance between pairs.

SUMMARY OF THE INVENTION

The above-discussed and other drawbacks and deficiencies of the prior art are overcome or alleviated by the impedance controlled, electrically balanced wiring block assembly of the present invention. In accordance with the present invention, the electrically balanced wiring block assembly employees a printed circuit board which includes impedance controlled circuitry with integrally defined capacitive elements designed to improve electrical balance between interconnected wiring and connecting strips and thereby optimize its transmission performance. The transmission lines consist of impedance controlled circuitry with integral capacitive elements are provided by means of a novel use of plated through holes. The traces are sized and spaced to provide a given characteristic impedance that is designed to match that of the balanced cable to which it is connected (typically 100 ohms). This impedance controlled circuitry is connected to capacitive holes that may be sized, spaced and interconnected in various configurations to generate the desired capacitance. This method of tuning capacitive balance between pairs makes use of well known elements of printed circuitry and their corresponding parasitic proportioning to produce a new desired effect. An extremely repeatable and economical means of adding capacitance to electrical circuits is obtained by the method of the present invention. Two rows of connecting blocks with a row of connecting strips therebetween are mounted to one side of the circuit board preferably by solderless means and are interconnected by circuitry on the circuit board. The capacitive elements are connected between selected leads of the connecting blocks and connecting strips by the circuitry such that, when it is interrupted by insertion of a patch connector or test adapter, the appropriate amount of compensation still exists for the two circuits that extend between the wire termination and center connecting strips as a result of separating the "break-test" contacts. The circuit board is mounted onto a bracket which is itself mounted onto a wiring block base.

A disconnect plug is provided for breaking electrical connection between selected connecting block positions by separating contacts at selected connecting strip positions. The plug includes an insulated dividing member which is inserted between the selected connecting strip contacts. The plug and strip housing further include means for aligning and retaining the plug on the connecting strip. The strip housing and disconnect plug are designed such that circuits may only be interrupted in one pair increments. Insertions at the plug between pairs (i.e., and ring of adjacent pairs) is prevented.

Also, a modular jack test assembly is provided for testing and/or at other times when modular jack connection is desired. The modular jack test assembly comprises a modular jack mounted on a circuit board having edge contacts for mating with the contacts of the connecting strip. The modular jack and circuit board are enclosed in a housing assembly which includes means for aligning and retaining the modular jack test assembly on the connecting strip. The strip housing and test plug are designed such that the circuit may only be accessed in increments of one pair. They also include polarity features to ensure that the plug can only be inserted when oriented one way. All keying and polarity features are designed to present access to the center contacts unless the test plug is properly aligned and oriented. The printed circuit board with the modular jack may also include integrally defined capacitive elements designed to improve electrical balance between the modular jack and the edge contacts on the circuit board and thereby optimize its crosstalk performance.

Devices that are electrically short relative to the wavelength of the signals they are intended to carry are commonly modeled as discrete (or lumped) elements. Since the maximum frequency used to characterize connecting hardware for twisted-pair cabling is 100 MHz as defined in TSB40, components whose electrical length is less than one-eighth the signal wavelength at this frequency may be treated as a single electrical entity, rather than a series of discrete elements. For example, a 100 MHz signal has a wavelength ($\lambda$) of approximately 3 meters, therefore the properties of the individual components that a connector is composed of (i.e., wire termination means, break-test means, and printed circuitry), behave as a single electrical entity, provided that the total electrical length between input and output connections does not exceed 3 meters÷8=38 cm.

The fact that the properties of the individual elements of a connector exhibit an "averaging" effect permits the introduction of electrical compensation means, such that the adverse electrical properties of one portion of the connector, may be offset by the introduction of appropriate reactive compensation means in another. In the case of the present invention, printed circuitry is used in a novel way to compensate for impedance discontinuities and capacitive imbalance caused by the wire connection means and break test means that are connected thereto.

The above-discussed and other features and advantages of the present invention will be appreciated and understood by those skill in the art from the following detailed description and drawings.

BRIEF DESCRIPTION OF THE DRAWINGS

Referring now to the drawings wherein like elements are numbered alike in the several FIGURES:

FIGS. 1A–C are views of a wiring block in accordance with the present invention wherein FIG. 1A is a top plan view thereof, FIG. 1B is a side elevational view thereof, and FIG. 1C is an end view thereof;

FIGS. 2A–B are views of a base used in the wiring block of FIGS. 1A–C wherein FIGS. 2A is a top plan view thereof and FIG. 2B is an end view thereof;

FIGS. 3A–E are views of a bracket used in the wiring block of FIGS. 1A–C wherein FIG. 3A is a top plan view thereof, FIG. 3B is a side elevational view thereof, FIG. 3C is an end view thereof, FIG. 3D is a bottom view thereof, and FIG. 3E is a view taken along the line 3E—3E of FIG. 3D;

FIGS. 4A–C are views of a circuit board used in the wiring block of FIGS. 1A–C wherein FIG. 4A is a top view thereof, FIG. 4B is a side elevational view thereof, and FIG. 4C is a bottom view thereof;

FIG. 5 is a side elevational partly cross sectional view of a connecting block mounted on a circuit board, partially shown, used in the wiring block of FIGS. 1A–C;

FIGS. 6A–D are views of a connecting strip used in the wiring block of FIGS. 1A–C wherein FIG. 6A is a side elevational view thereof, FIG. 6B is a top view thereof, FIG. 6C is an end view thereof, and FIG. 6D is a view in partial cross-section taken along the line 6D—6D of FIG. 6A;

FIGS. 7A–G are views of a housing used in the connecting strip of FIGS. 6A–D wherein FIG. 7A is a side elevational view thereof, FIG. 7B is a top view thereof, FIG. 7C is a bottom view thereof, FIG. 7D is a view taken along the line 7D—7D of FIG. 7C, FIG. 7E is an end view thereof, FIG. 7F is a view taken along the line 7F—7F of FIG. 7A, and FIG. 7G is a view taken along the line 7G—7G of FIG. 7A;

FIGS. 8A–D are views of a contact used in the connecting strip of FIGS. 6A–D wherein FIG. 8A is a side elevational view thereof, FIG. 8B is an end view thereof, FIG. 8C is a view taken along the line 8C—8C of FIG. 8A, and FIG. 8D is a view taken along the line 8D—8D of FIG. 8A;

FIGS. 9A–D are views of the wiring block of FIGS. 1A–C without the base of FIGS. 2A–B wherein, FIG. 9A is a top plan view thereof, FIG. 9B is a side elevational view thereof, FIG. 9C is an end view thereof, and FIG. 9D is a view in partial cross section taken along the line 9D—9D of FIG. 9B;

FIGS. 10A–C are views of a wiring block in accordance with an alternate embodiment of the present invention wherein FIG. 10A is a top plan view thereof, FIG. 10B is a side elevational view thereof in partial cross-section and FIG. 10C is an end view thereof;

FIGS. 11A–E are views of a disconnect plug for use with the connecting strip of FIGS. 6A–D in accordance with the present invention wherein FIG. 11A is a side elevational view thereof, FIG. 11B is a first end view thereof, FIG. 11C is a second end view thereof in partial cross-section, FIG. 11D is a view taken along the line 11D—11D of FIG. 11C, and FIG. 11E is a view taken along the line 11E—11E of FIG. 11B;

FIGS. 12A–D are views of a first portion of a cover assembly in accordance with the present invention wherein FIG. 12A is an exterior side elevational view thereof, FIG. 12B is an end view thereof, FIG. 12C is a view taken along the line 12C—12C of FIG. 12A, and FIG. 12D is an interior side elevational view thereof;

FIGS. 13A–E are views of a second portion of the cover assembly in accordance with the present invention wherein FIG. 13A is an interior side elevational view thereof, FIG. 13B is an end view thereof, FIG. 13C is a view taken along the line 13C—13C of FIG. 13A, FIG. 13D is an exterior side elevational view thereof, and FIG. 13E is a view taken along the line 13E—13E of FIG. 13A;

FIGS. 14A–C are views of a modular jack mounted on a circuit board in accordance with the present invention wherein FIG. 14A is side elevational view thereof, FIG. 14B is an end view thereof, and FIG. 14C is a top view thereof;

FIGS. 15A–C are view of the circuit board of FIGS. 14A–C wherein FIG. 15A is a first side view thereof, FIG. 15B is an end view thereof, and FIG. 15C is a second side view thereof.

FIGS. 16A–D are views of the circuit board of FIGS. 14A–C in accordance with an alternate embodiment wherein FIG. 16A is a first side view thereof, FIG. 16B is an end view thereof, FIG. 16C is a second side view thereof; and FIG. 16D is a schematic of the electrical connections thereof;

FIGS. 17A–D are views of the circuit board of FIGS. 14A–C in accordance with an alternate embodiment wherein FIG. 17A is a first side view thereof; FIG. 17B is an end view thereof, FIG. 17C is a second side view thereof and FIG. 17D is a schematic of the electrical connections thereof;

FIGS. 18A–D are views of the circuit board of FIGS. 14A–C in accordance with an alternate embodiment wherein; FIG. 18A is a first side view thereof; FIG. 18B is an end view thereof, FIG. 18C is a second side view thereof, and FIG. 18D is a schematic of the electrical connections thereof;

FIGS. 19A–D are views of the modular jack and circuit board of FIGS. 14A–C installed within the cover assembly of FIGS. 12A–D and 13A–E in accordance with the present invention wherein FIG. 19A is a side elevational view thereof, FIG. 19B is an end view thereof, FIG. 19C is a bottom view thereof, FIG. 19D is a top view thereof, and FIG. 19D is a schematic of the electrical connections thereof.

FIGS. 20A–D are views of a modular jack with a circuit board installed in a cover assembly in accordance with an alternate embodiment of the present invention wherein FIG. 20A is a side elevational view thereof, FIG. 20B is an end view thereof, FIG. 20C is a bottom view thereof, and FIG. 20D is a top view thereof;

FIGS. 21A–E are views of a first portion of the cover assembly of FIGS. 20A–D wherein FIG. 21A is an exterior side elevational view thereof, FIG. 21B is a view taken along the line 21B—21B of FIG. 21A, FIG. 21C is an end view thereof, FIG. 21D is an interior side elevational view thereof, and FIG. 21E is a top view thereof;

FIGS. 22A–E are views of a second portion of the cover assembly of FIGS. 20A–D wherein FIG. 22A is an interior side elevational view thereof, FIG. 22B is an end view thereof, FIG. 22C is a view taken along the line 22C—22C of FIG. 22A, FIG. 22D is an exterior side elevational view thereof, and FIG. 22E is a view taken along the line 22E—22E of FIG. 22A;

FIGS. 23A–C are views of the modular jack mounted on the circuit board of FIGS. 20A–D wherein FIG. 23A is a side elevational view thereof, FIG. 23B is an end view thereof, and FIG. 23C is a top view thereof; and FIGS. 24A–E are views of the circuit board of FIGS. 23A–C wherein FIG. 24A is a first side view thereof, FIG. 24B is an end view thereof, FIG. 24C is a second side view thereof, FIG. 24D is a schematic of the electrical connections thereof, and FIG. 24E is a schematic of the electrical connections of an optional 2-pair test adapter.

FIGS. 25A–C are plots of performance data for the block of U.S. Pat. No. 5,044,979 as a function of frequency wherein FIG. 25A is a plot of attenuation thereof, FIG. 25B is a plot of NEXT thereof, and FIG. 25C is a plot of return loss thereof;

FIGS. 26A–C are plots of performance data for the AT&T 110T-50 block as a function of frequency wherein FIG. 26A is a plot of attenuation thereof, FIG. 26B is a plot of NEXT thereof, and FIG. 26C is a plot of return loss thereof;

FIGS. 27A–C are plots of performance data in accordance with the present invention as a function of frequency wherein FIG. 27A is a plot of attenuation thereof, FIG. 27B is a plot of NEXT thereof, and FIG. 27C is a plot of return loss thereof.

DESCRIPTION OF THE PREFERRED EMBODIMENT

Figure 1C:
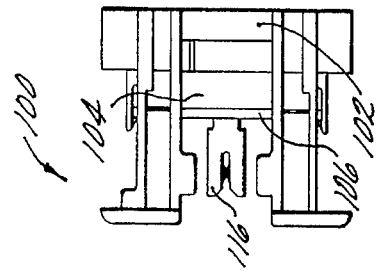
Figure 1A:
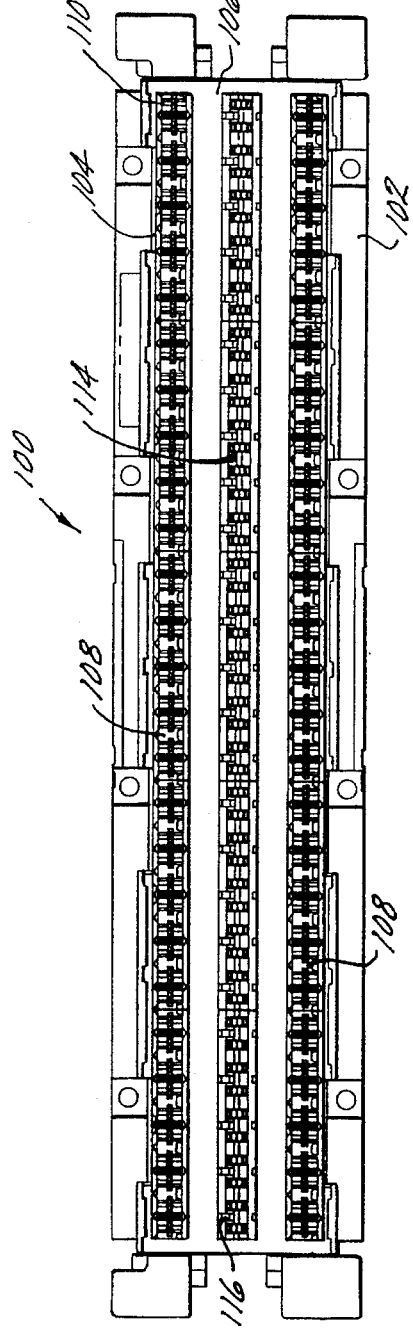
Figure 1B:
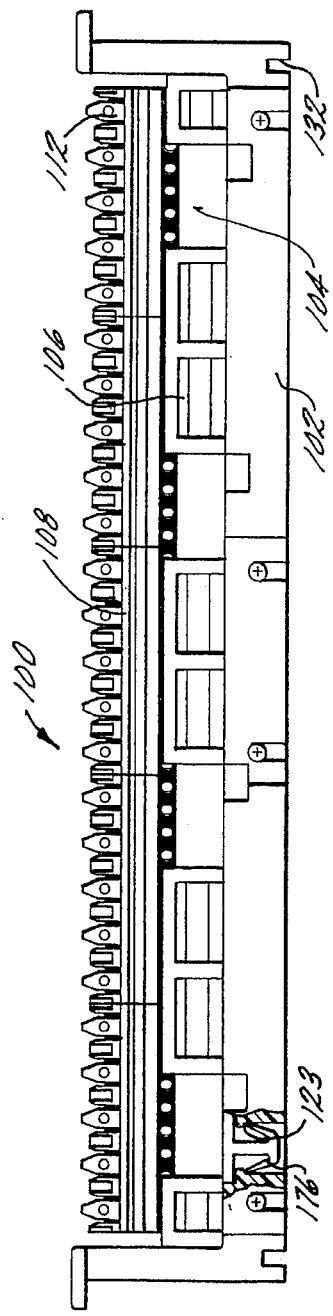

Referring to FIGS. 1A–C, a wiring block in accordance with the present invention is shown generally at 100. Wiring block 100 comprises a base 102 having a mounting bracket 104 snap lock mounted onto one surface thereof. A circuit board 106 is snap lock mounted onto bracket 104. A plurality of connecting blocks 108 are mounted on circuit board 106 along two rows 110 and 112. The connecting blocks 108 are shown in FIG. 5 herein and are described in detail in U.S. patent application Ser. No. 07/932,495, filed Aug. 20, 1992, which is assigned to the assignee hereof and incorporated herein by reference. While only two rows of connecting blocks 108 are shown in FIGS. 1A–C, it is contemplated by the present invention that any number of connecting block rows may be employed with an appropriate base. A plurality of connecting strips 114 are mounted on circuit board 106 along a row 116 between rows 110 and 112.

Figure 2A:
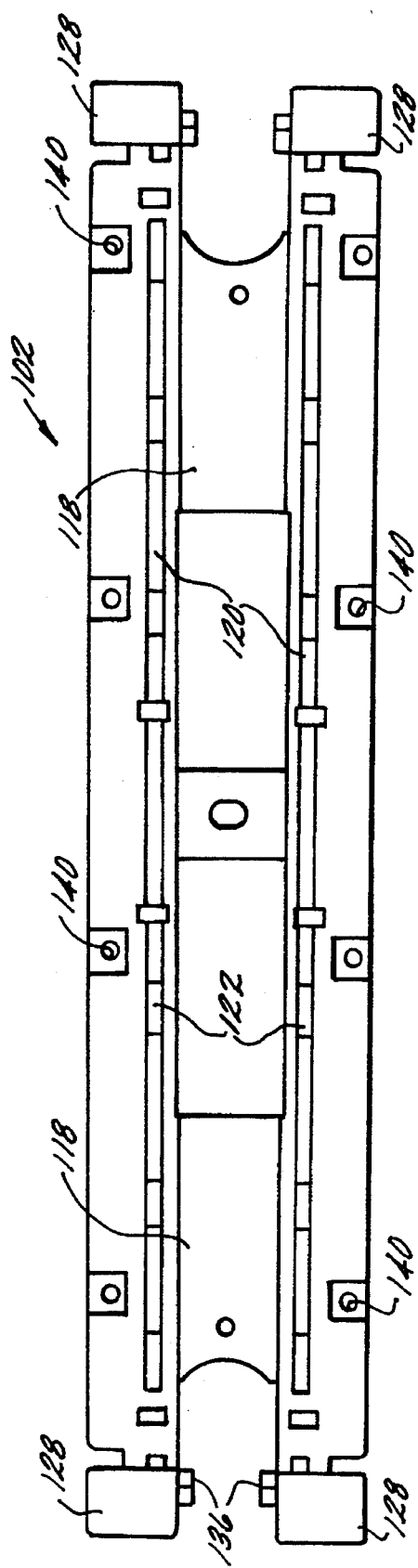
Figure 2B:
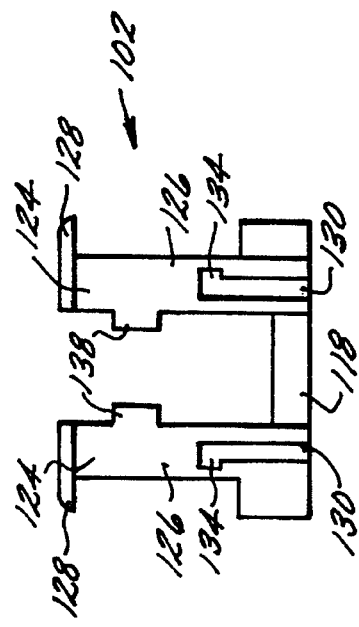

Referring to FIGS. 2A–B, base 102 includes an upper surface 118 with a plurality of longitudinally extending channels 120 therein. Each channel 120 has a plurality of rectangular openings 122 therethrough. Retaining ledges 123 (FIG. 1B) are defined within openings 122 for retaining bracket 104 on base 102. At each end of base 102 in alignment with each channel 120 is an upright member 124. Upright members 124 each comprise a member 126 extending upwardly from base 102 and terminate in a generally rectangular platform 128. A slot 130 extends through a lower portion of member 126 and includes a perpendicular notch 132 (FIG. 1B) at the lower end thereof. Notch 132 and slot 130 form a cross shaped opening. Also a retaining ledge 134 is defined at the inner facing surface of slot 130. The above features are consistent with a prior art wiring block that is appropriate for use with the present invention. This block, which may or may not be used with the detachable leg assemblies, is described in U.S. patent application Ser. No. (USSN) 07/934,923 filed Aug. 25, 1992, now U.S. Pat. No. 5,312,270 which is assigned to the assignee hereof and is incorporated herein by reference. Extending from one side of each member 126 is a retaining edge with a cooperating angled surface 136. Also, a protruding member 138 extends from the same side of member 126 as does the retaining edge and surface 136 with member 138 being adjacent to surface 136. The retaining edge, surface 136 and member 138 provide means for retaining a designation strip of the type described in U.S. Ser. No. 07/934,923 designated as 129 in FIG. 6 thereof.

Also base 102 has a plurality of mounting holes 140 along the sides thereof. Holes 140 allow for attachment of wiring block 100 to a surface (typically a wiring closet wall or panel).

Referring to FIGS. 3A–E, mounting bracket 104 includes a base member 142 having upper and lower surfaces 144, 146 respectively. A plurality of rails 148, 148' on surface 144 define channels 150. A wall 152 at each end of bracket 104 closes off the ends of channels 150. Side rail 148' included a plurality of cut outs 154. Each cut out 154 is closed off by a side retaining member 156. Each side retaining member 156 includes a support ledge 158 formed integrally therewith. Rails 148, 148', walls 152 and ledges 158 all extend upwardly from surface 144 the same distance, thereby defining a support surface having channels 150 therein. A plurality of resilient panels 160 extend upwardly from each side 162, 164 of bracket 104. Panels 160 are located along the sides of bracket 104 and between side retaining members 156. Each panel 160 includes upright members 166 connected by an upper member 168. Further, each panel 160 includes an angled surface 170 on member 168 defining a retaining ledge 172.

A pair of longitudinal rails 174 depend downwardly from the lower surface 146 of bracket 104. Each rail 174 is received in corresponding channel 120 of base 102. A plurality of posts 176 extend downwardly from a lower surface 178 of each rail 174. A pair of upwardly and outwardly extending resilient arms 180 depend from opposing sides of the lower most end of each post 176. Posts 176 and associated arms 180 pass through openings 120 of base 102, wherein arms 176 engage ledges 123 (FIG. 1B), thereby retaining wiring bracket 104 on base 102.

Figure 4A:
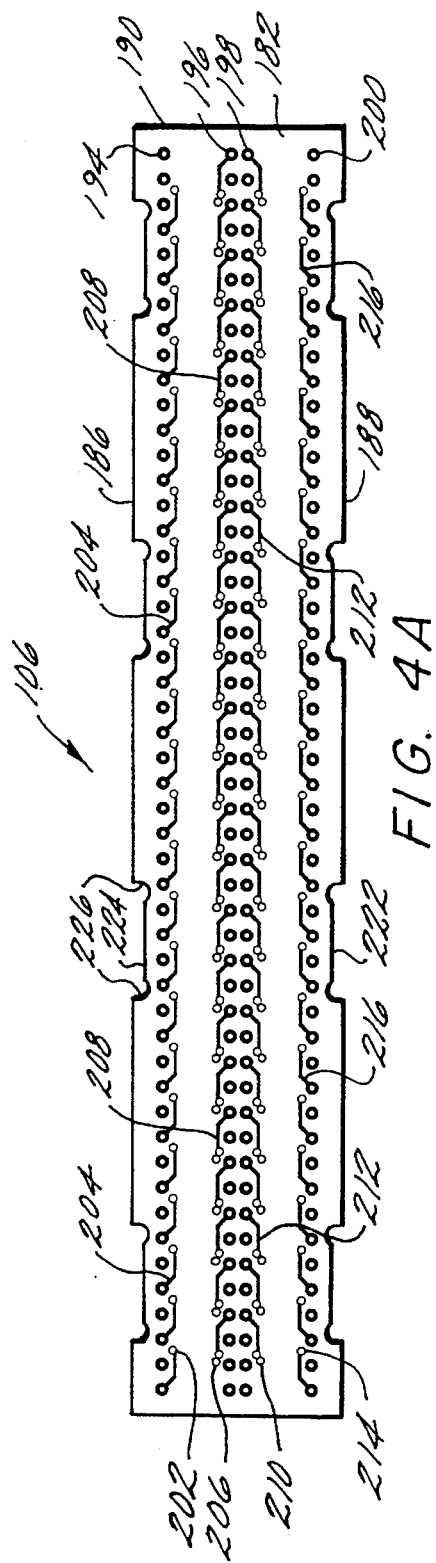
Figure 4B:
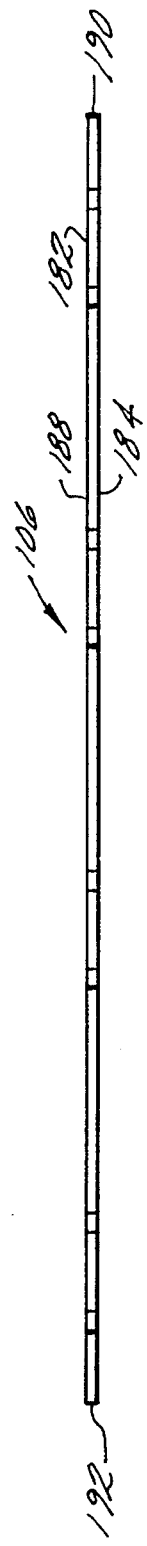
Figure 4C:
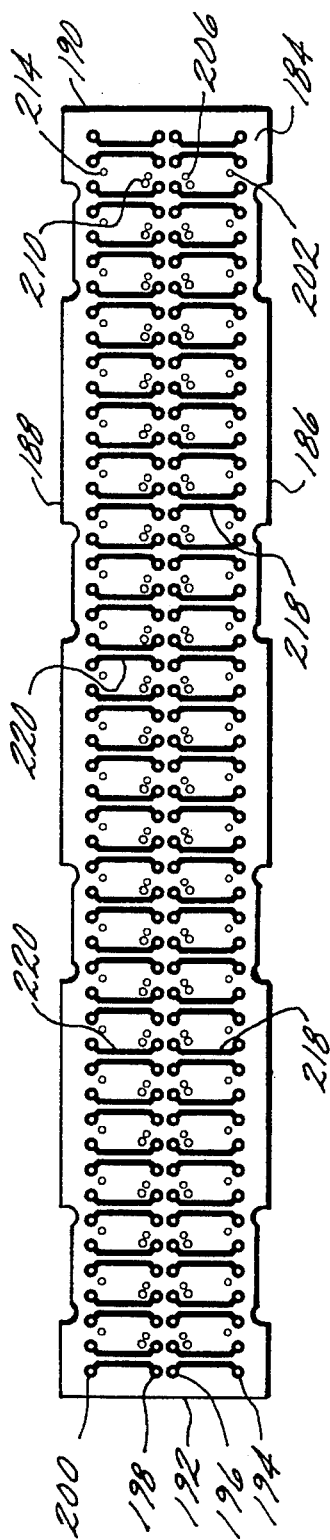

Referring to FIGS. 4A–C, circuit board 106 is shown. Board 106 is a two-sided printed circuit board having a plurality of vias or feed-through holes therethrough. Circuit board 106 includes opposing surfaces 182, 184, opposing sides 186, 188 and opposing ends 190, 192. A first row of pads 194 having plated feedthrough holes accepts connecting blocks 108 in row 110, second and third rows of pads 196, 198 having plated feed-through holes accepts connecting strips 114 in row 116, and a fourth row of pads 200 having plated feed-through holes accepts connecting blocks 108 in row 112. A fifth row of plated through holes 202 is disposed adjacent the first row of pads 194, with through holes 202 connected to selected pads 194 by circuit traces 204 on surface 182. A sixth row of interconnected plated through hole pairs 206 is disposed adjacent the second row of pads 196, with through holes pairs 206 connected to selected pads 196 by circuit traces 208 on surface 182. A seventh row of interconnected plated through hole pairs 210 is disposed adjacent the third row of pads 198, with through hole pairs 210 connected to selected pads 198 by circuit traces 212 on surface 182. An eighth row of plated through holes 214 is disposed adjacent the fourth row of pads 200, with through holes 214 connected to selected pads 200 by circuit traces 216 on surface 182. Further, pads 194 are connected to corresponding pads 196 by circuit traces 218 on surface 184, and pads 200 are connected to corresponding pads 198 by circuit traces 220 on surface 184.

Sides 186 and 188 of circuit board 106 included a plurality of recesses 222 each being defined by an edge surface 224 terminating in accurate surfaces 226. Recesses 222 align with the cut out portions 154 of bracket 104, when circuit board 106 is mounted on bracket 104, as will be described hereinafter.

Through holes 202, 214 and through hole pairs 206, 210 are positioned and connected to selected through holes 194, 196, 198 and 200, and circuitry 220, 218 is laid out, whereby the above configuration induces a desired capacitance within the circuit.

Coupling between through holes 200 and 214 and between through holes 194 and 202 are designed to offset capacitive imbalance that is caused by connecting blocks 108. Coupling between through holes 198 and through hole pairs 210 and between through holes 196 and through hole pairs 206 are designed to offset capacitive imbalance that is caused by the corresponding rows of connecting strips 114. Since it is preferable to place the compensation means electrically close to the connector being compensated, there are actually four sets of compensation means for each through circuit; two to compensate for connecting blocks 108 and two to compensate for connecting strips 114.

Figure 4D:
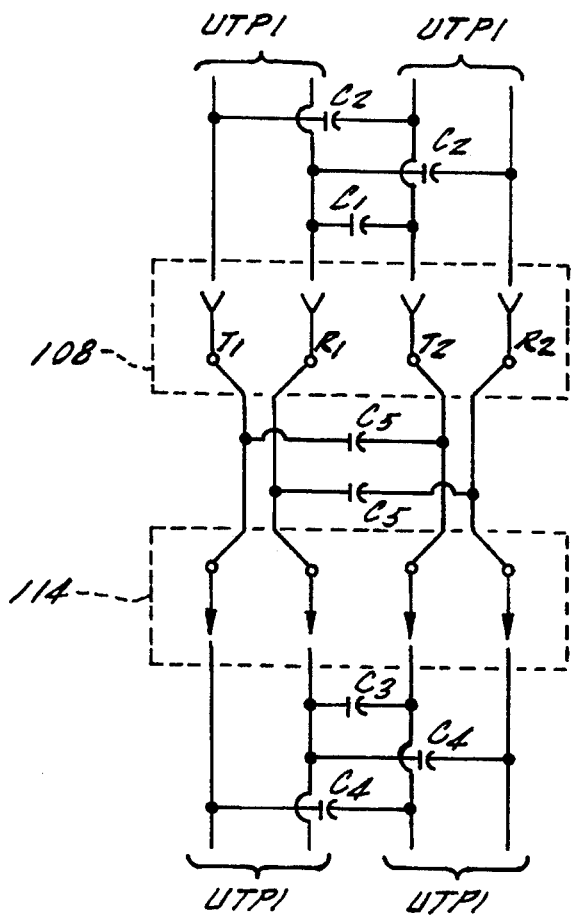
FIG. 4D is a schematic of the capacitive compensation means employed by the present invention.

Referring to FIG. 4D, capacitor designated C5 represents the combined effects of the two sets of capacitive holes that reside on either the input or output side of the circuit. This 'distributed' compensation means has the additional benefit of preserving performance, even when the circuit is interrupted for testing or patching. The benefit provided by these capacitive through holes is manifested by the NEXT performance traces of FIGS. 25B–27B, described hereinafter. FIG. 27B shows that the present invention exhibits NEXT performance that is 8 dB better than that of FIG. 25B and 11 dB better than that of FIG. 26B. Capacitive coupling between adjacent pairs of connecting block 108 can be expressed as $C_{unbalanced\ at\ block\ 108} = C_1 - C_2$. Capacitive unbalance between adjacent pairs of connecting strip 114 (input or output half only) can be expressed as $C_{unbalanced\ at\ one\ half\ of\ strip\ 114} = C_3 - C_4$. Capacitance required to restore pair-to-pair balance between connecting block 108 and one half of connecting strip 114 can be expressed as $C_5 = C_{unbalance\ at\ block\ 108} + C_{unbalance\ at\ one\ half\ of\ strip\ 114} = (C_1 + C_3) - (C_2 + C_4)$.

Figure 4E:
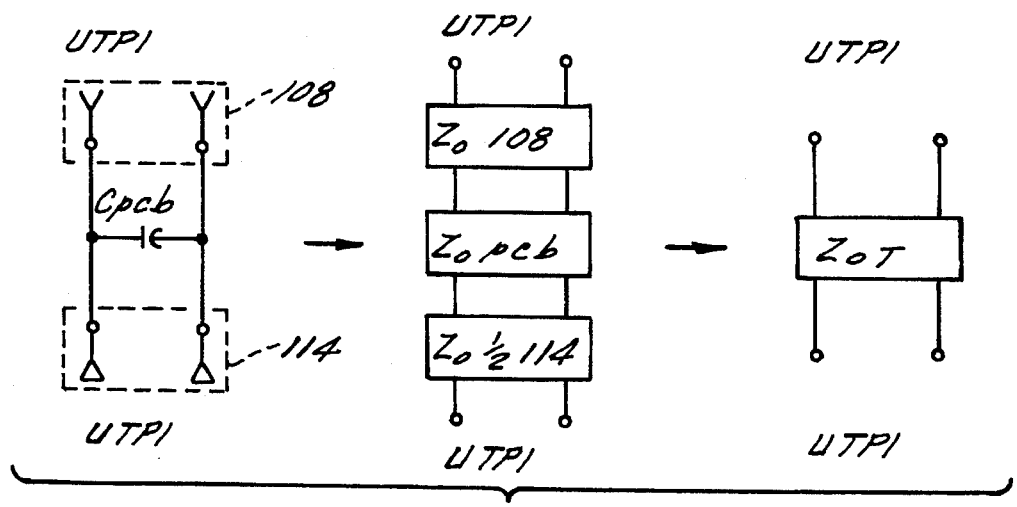
FIG. 4E is a schematic of the impedance matching means employed by the present invention.

Referring to FIG. 4E, circuit traces 220 and 218 are designed in accordance with the impedance enhancement principle shown. Theoretical characteristic impedance (combined elements) can be expressed as:

$$Z_o^T = [L_T/C_T]^{1/2} = [L_{pcb} + L_{108} + L_{\frac{1}{2}\ 114}/C_{pcb} + C_{108} + C_{\frac{1}{2}\ 114}]^{\frac{1}{2}}$$

First, characteristic impedance required to match that of the twisted pair cable (UTP) (e.g. $Z_o^{T=100\ ohms}$) is selected. Then the total inductance (or capacitance, including printed circuit board traces is determined by theoretical and/or empirical means. The capacitance (or inductance) between tip and ring conductors of connecting block 108 and one half (or side) of connecting strip 114 is determined by theoretical and/or empirical means. The required tip to ring capacitance to achieve an equivalent characteristic impedance of $Z_o^T$ through the following relation is calculated:

$$C_{pcb} = (L_{pcb} + L_{108} + L_{\frac{1}{2}\ 114}) - Z_o^{T2}\ (C_{108} + C_{\frac{1}{2}\ 114})/Z_o^2.$$

Alternatively, inductance may be calculated by a similar technique. Circuit geometry can be varied and/or through holes added to achieve tip-to-ring capacitance of $C_{pcb}$.

Using this technique, either inductance, or capacitance, or both may be varied on the circuit board to provide an input impedance that is matched with the cable to which it is connected for a given range of frequencies. The benefits of this impedance tuning technique are manifested in FIGS. 25A–27A and 25C–27C. Although the electrical length of the present invention is significantly greater than that of the prior art block disclosed in U.S. Pat. No. 5,044,479, the impedance tuning method taught by the present invention allows it to exhibit more than 7 dB better return loss than FIG. 25C at 100 MHz. Comparison to the results of FIG. 26C, (a product that has close to the same electrical length) shows that the present invention has more than 19 dB better return loss at 100 MHz. Because less signal energy is reflected back, the attenuation performance of the present invention is also better than that of these prior art blocks as evidenced by FIGS. 25A and 26A.

Figure 25A:
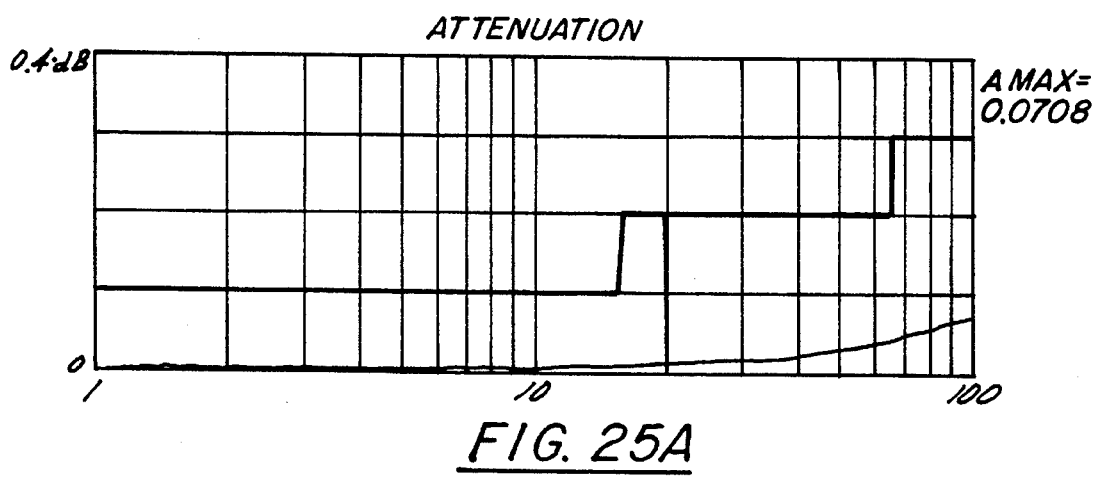
Figure 25B:
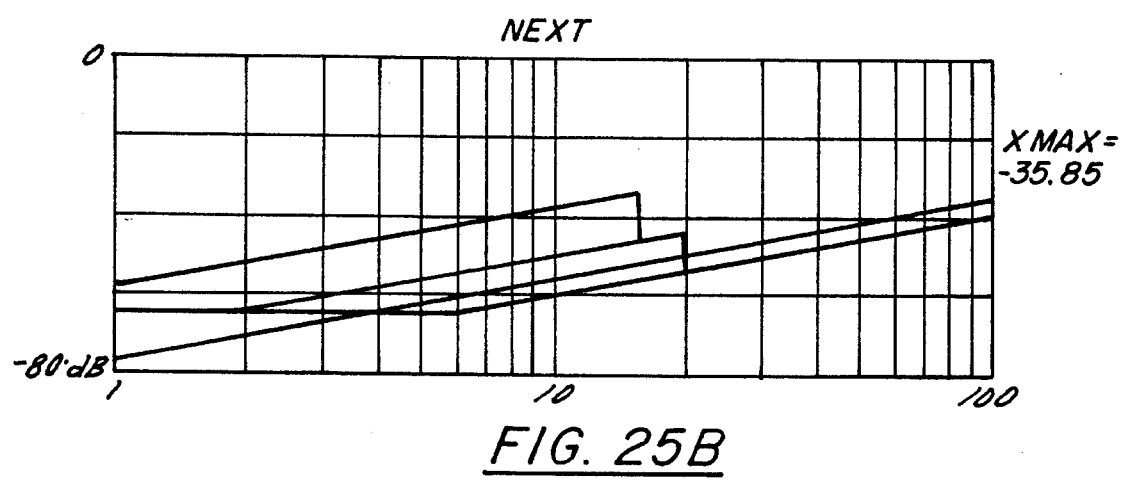
Figure 25C:
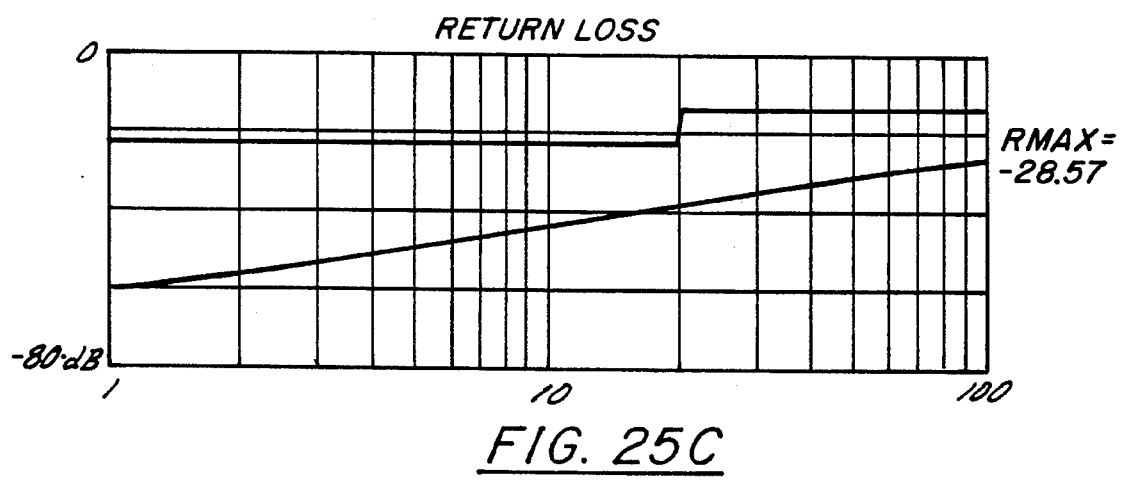

FIGS. 25A–C show worst case attenuation, NEXT and return loss performance data on the block of U.S. Pat. No. 5,044,979 as a function of frequency from 1 MHz to 100 MHz based on four adjacent pairs of twisted-pair wires. Although return loss and attenuation performance satisfy Category 5 crosstalk requirements by at least 4 dB (decibels). At 100 MHz the NEXT requirement is 40 dB or greater. This product measures only 35.9 dB at 100 MHz and consistently fails to meet Category 5 NEXT requirements at other frequencies.

Figure 26A:
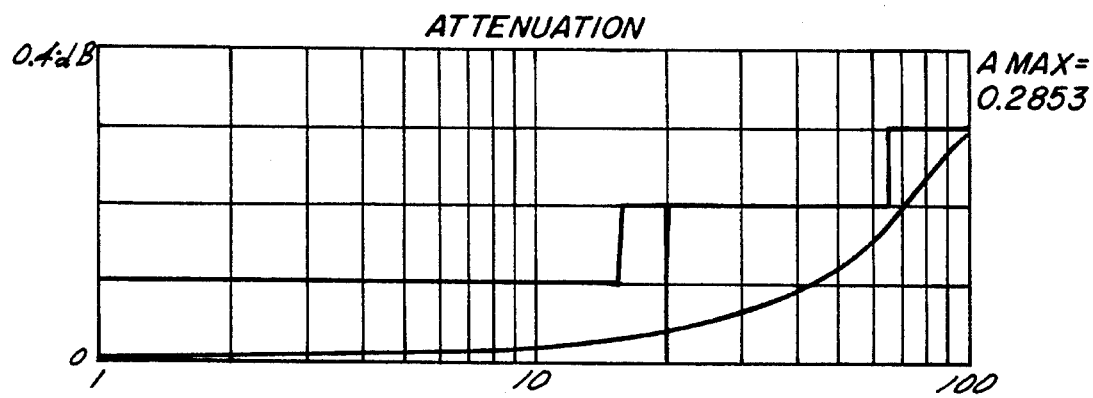
Figure 26B:
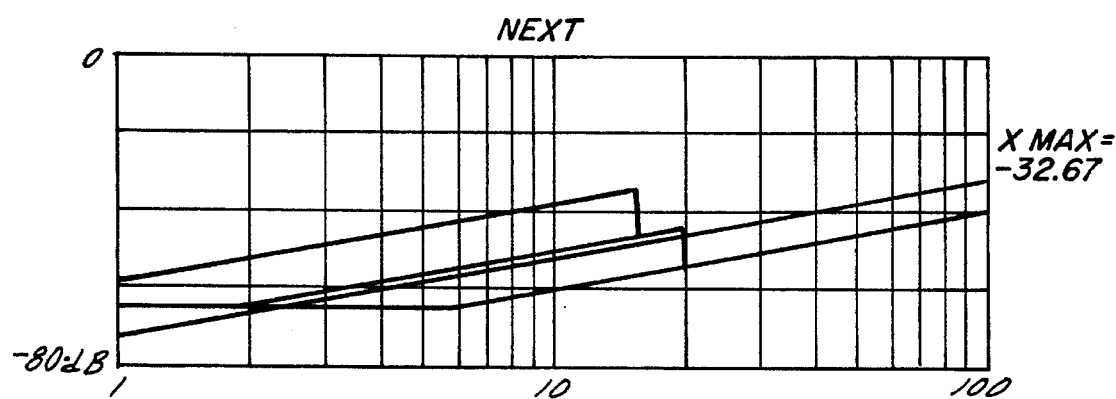
Figure 26C:
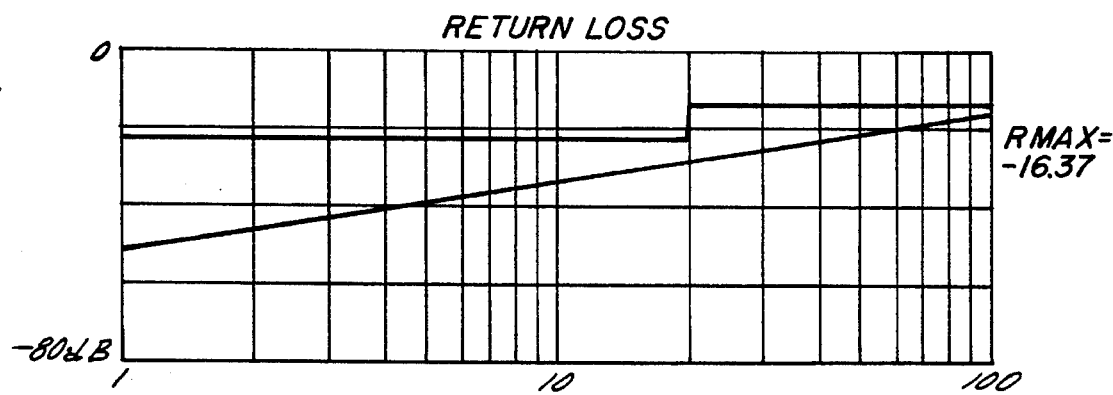
Figure 27A:
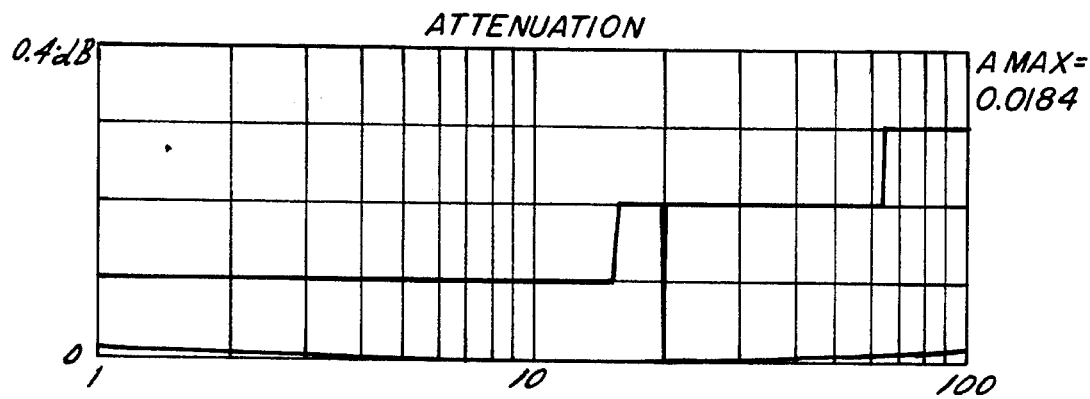
Figure 27B:
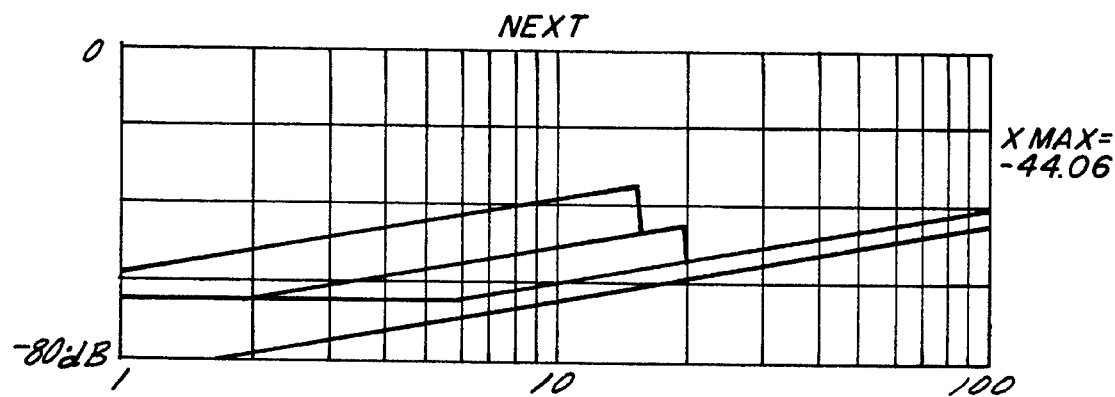
Figure 27C:
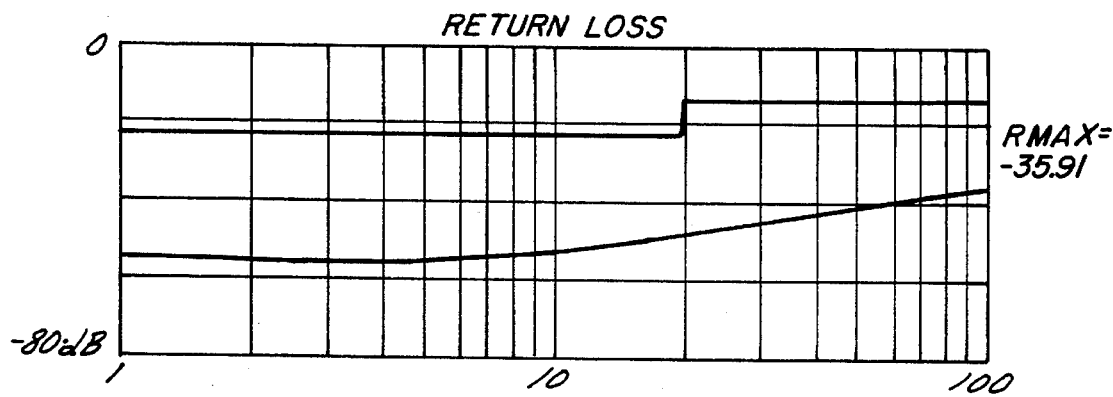

FIGS. 26A–C show worst case attenuation, NEXT and return loss performance data on the AT&T 110T-50 block as a function of frequency from 1 MHz (megahertz) to 100 MHz based on four adjacent pairs of twisted-pair wires. Although return loss and attenuation performance appear to satisfy Category 5 requirements, the NEXT performance of this product falls short of the TSB40 Category 5 crosstalk requirements by at least 7 dB. At 100 MHz the NEXT requirement is 40 dB or greater. This product measures only 32.7 at 100 MHz and consistently fails to meet Category 5 NEXT requirements at other frequencies.

A distinct advantage of the circuitry on board 106 is that separate compensation means is provided between through holes 198 and 200 and between through holes 194 and 196 such that, when the connection between through holes 196 and 198 is interrupted by inserting a patch connector or test adapter into connecting strip 114, the appropriate amount of compensation still exists for the two separate circuits that now extend between connecting block 108 and connecting strip 114.

For instances, when test access is desired without interrupt capability, it will be appreciated that the printed circuit board traces may optionally be provided between through holes 196 and 198 to permanently bridge the two opposing rows of connecting strips 114.

The advantage of using through holes, as opposed to discrete capacitors or capacitive pads to perform the tuning function that is necessary to achieve a desired level of transmission performance are manifold. Because they require no added components or secondary assembly operations, as do discrete capacitors, the capacitive through holes offer inherent advantages with respect to manufacturing cost as well as product reliability. Also, for circuit boards with the thickness needed to allow mounting of standard, off-the-shelf components, the magnitude of capacitance per unit area is much greater than that of overlapping capacitive pads on opposing surfaces. This benefit results from the fact that the capacitive coupling for through holes occurs on multiple planes rather than the unidirectional coupling that is characteristic of parallel pads or plates.

It will be appreciated that in an alternate embodiment (not shown), the diameter and spacing of the through holes may change as required by the physical and electrical constraints of the application or industry standard. Also, the pattern and width of the circuitry that forms the grids and the pads may vary according to the requirements of the individual outlet or connector. Thus providing a method of achieving a controlled amount of capacitive coupling between selected circuit paths of a connector which allows reactive imbalance between pairs that is caused by certain outlet wiring schemes and wire connectors to be compensated for, by the printed circuitry and through holes so as to allow a connection device to meet or exceed Category 5 requirements as described hereinbefore.

The benefits of "Category 5" devices are readily appreciated by one of ordinary skill in the art. The most significant being the substantial cost savings in using unshielded twisted pair wire where shielded, co-axial or fiber optic cable has been used in the past due to bandwidth limitations of the UTP.

Referring to FIG. 5, each connecting block described in U.S. Ser. No. 07/932,495, which is assigned to the assignee hereof and is incorporated herein by reference. Connecting (or connector) block 108 is substantially similar to the connecting block shown in FIGS. 3–8 of U.S. Pat. No. 4,964,812, which is also assigned to the assignee hereof and is incorporated herein by reference, with the important difference residing in the use of the beam contacts 228, which are of the type described in U.S. Ser. No. 07/932,495, in place of the prior art beam contacts of the type shown at 10 in FIG. 1 of U.S. Ser. No. 07/932,495. The use of beam contacts 228 permits connector block 108 to be mounted directly into through holes 194, 200 (not shown is this FIGURE) in circuit board 106 and retained therein by press-fit or soldering techniques.

In general, connector block 108 comprises a one-piece housing 230 composed of a suitable insulative material (preferably polycarbonate). Housing 230 is substantially rectangular in shape and includes a plurality of spaced apart teeth 232 and 234 along the length of its upper surface. The remaining details regarding connector 108 are found in great detail in U.S. Pat. No. 4,964,812 and U.S. Ser. No. 07/932,495, and reference should be made thereto for further description. The housing may or may not have stand-off ribs 236 placed along the bottom surface to facilitate solder flux removal for the clip embodiment shown in FIGS. 2 and 3 of U.S. Ser. No. 07/932,495.

As in U.S. Pat. No. 4,964,812, each terminal clip 228 is retained within housing 230 by a pin 238 which extends through opening 240 of the terminal clip. The connector block 108 is assembled to terminal clips 228 in accordance with a method shown in FIGS. 6A–6D of U.S. Pat. No. 4,964,812 wherein each pin is initially flash molded to housing 230 and thereafter driven through the housing 230 and opening 240 in a manner described in U.S. Pat. No. 4,964,812.

Referring to FIGS. 6A–D, 7A–G and 8A–D, one of the connecting strips is shown generally at 114. Connecting strip 114 comprises a generally rectangular housing 242 having a top surface 244, a bottom surface 246, sides 248, 250 and ends 252, 254. A plurality of rectangular openings 256 extend from the top surface 244 through to the bottom surface 246. A U-shaped channel 258 extends from end 252 through to end 254. The upper ends of the U-shaped channel terminate in angled surfaces 260. Each opening 256 includes a central portion which is slightly narrower than the upper and lower portions of the opening. The upper portion tappers inwardly at inclined surface 262 to the central portion. The lower portion steps inwardly at surface 264 to the central portion. The bottom 246 of housing 242 includes an inward step along each side 248, 250 thereof, which defines ledges 266. Slots 268 are formed in each corner, at the lower end of each opening 256. The lower end of slots 268 being tappered.

A plurality of vertical slots 270 are defined at the outer surface of side 248. Each slot 270 includes a step 272 which continues downwardly to a ramp surface 274 followed by an angled retaining surface 276. A plurality of vertical slots 278 are defined at the outer surface of side 250. Each slot 278 includes a ramp surface 280 followed by an angled retaining surface 282 near the lower end of the slot and in alignment with ramp 274 and surface 276. Further, each slot 270 is aligned with a corresponding slot 278.

A plurality of contacts 284 are inserted into openings 256. Each contact 284 includes a base portion 286 which comprises a rectangular shaped plate. Plate 286 has a portion thereof cut to form a tab 288 which is bent away from the plate as shown in FIG. 8B. Plate 286 also includes an opening 290 therethrough. A tail portion 292 extends from the lower end of plate 286.

The tail portion 292 may comprise any of the tail portions 40, 46 or 72 described in U.S. Ser. No. 07/932,495. In this example, the tail portion 292 has a shape similar to that of a needle's eye (sometimes referred to as "eye-of-the-needle" and also referred to herein as an eyelet) which comprises an oblong stem (or tail) 294 with an axially aligned, longitudinal inner oblong or lenticular opening 296 through stem 294. The outer opposed edges 298 of stem 294 are coined as described in U.S. Ser. No. 07/932,495.

A resilient arm 300 extends generally upwardly from plate 286. Arm 300 includes a straight portion 302 extending upwardly at an angle relative to plate 286 and in a direction opposite the displacement of tab 288. Depending upwardly following the straight portion 302 is an accurate portion 304, having the outer edges 305 thereof coined, in a direction opposite that of the angular offset of portion 302. Again depending upwardly following the accurate portion 304 is a second straight portion 306 having tappered corners.

Two opposing contacts 284 are inserted in each opening 256 such that the accurate portion 304 of each of the contacts within an opening is biased against the other. Further, plate 286 of each contact 284 is received in a corresponding pair of slots 268 of housing 242, whereby tab 288 engages surface 264 within opening 256 acting as a stop. Also tab 288 is biased against the inside surface of the corresponding side of housing 242 to retain the contacts within the openings. Openings 256 are sufficient in size to allow deflection of contacts 284 during insertion of a mating component.

Referring to FIGS. 9A–D, circuit board 106 is shown snap lock mounted onto bracket 104. Circuit board 106 after having been populated with connecting blocks 108 and connecting strips 114 by either press fit or soldered, as described above, is mounted onto bracket 104. Typically one side of circuit board 106 is positioned whereby the side edge of the circuit board is against the inside of corresponding panels 160 with edges 172 engaging surface 182 of the circuit board. Then the opposite side of the circuit board is installed by exerting a downward force on that side of the circuit board. This force causes that side edge of the circuit board to engage ramp surface 170 thereby urging corresponding panels 160 to flex outwardly until the circuit board travels past surface 170. At this point panels 160 snap back into an upright position whereby edges 172 engage surface 182 of the circuit board along this side. Alternatively, the circuit board may be positioned on the panels 160 whereby both sides of the circuit board are urged into the bracket as described above for one side. Although, it should be noted that the latter method of insertion is not the preferred method.

When circuit board 106 is fully inserted into bracket 104, surface 184 of circuit board 106 is supported on the upper surfaces of rails 148, 148' and held there by edges 172. Tail ends 194 and 292 are received in corresponding channels 150, as shown in FIG. 9D.

The assembly shown in FIGS. 9A–D is then inserted into base 102, whereby arms 180 pass through openings 120 of base 102 and engage ledges 123 as described hereinbefore, resulting in the wiring block 100 shown in FIGS. 1A–C.

Figure 10C:
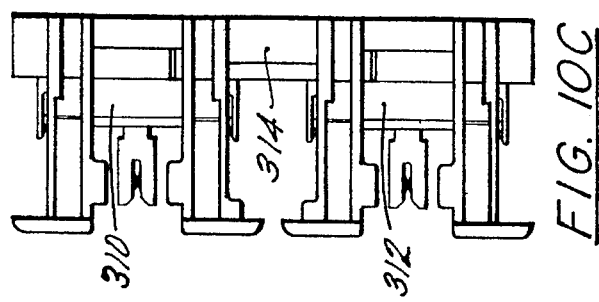
Figure 10A:
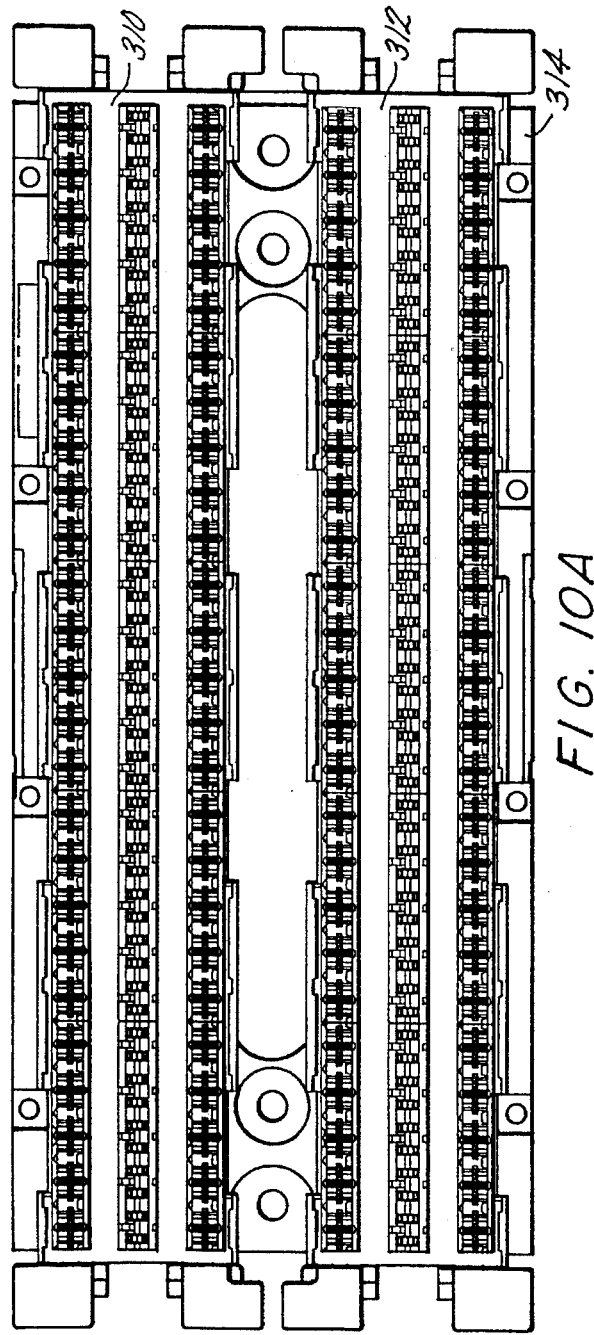
Figure 10B:
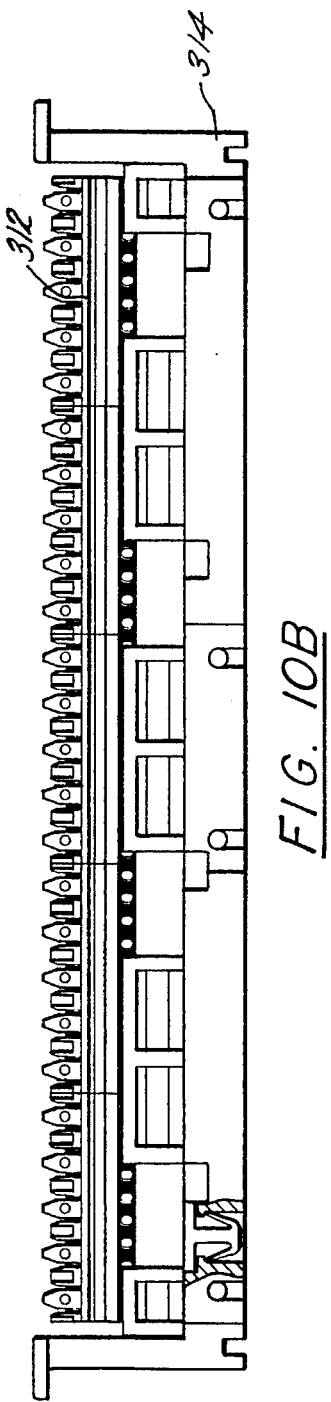
Figure 14C:
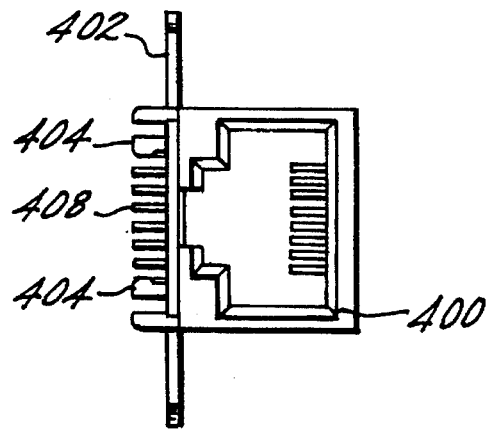
Figure 14B:
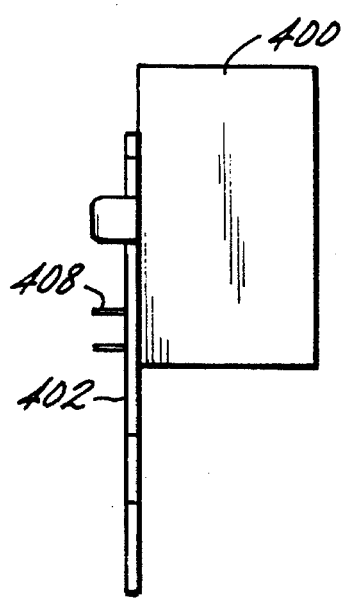
Figure 14A:
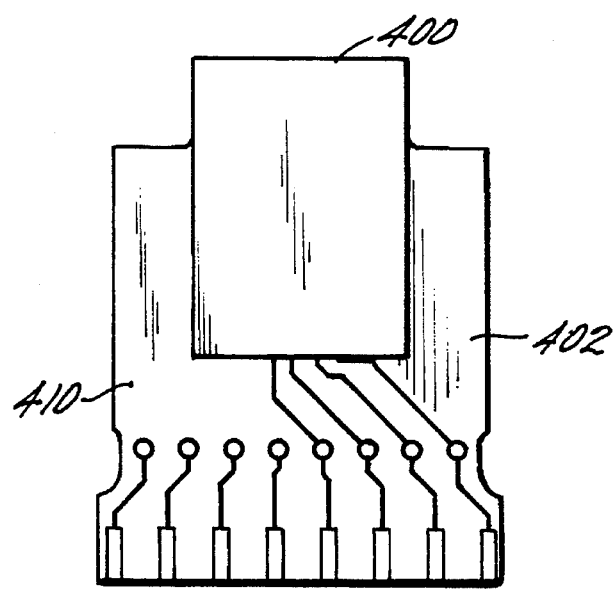
Figure 15D:
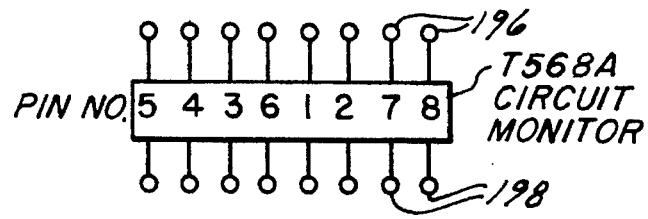
FIG. 15D is a schematic of the electrical connections thereof.
Figure 15A:
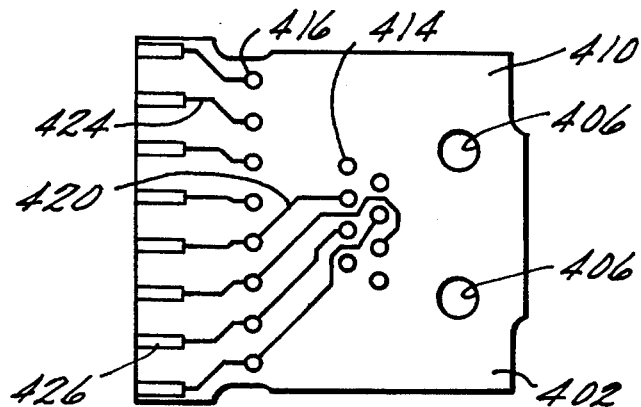
Figure 15B:
Figure 15C:
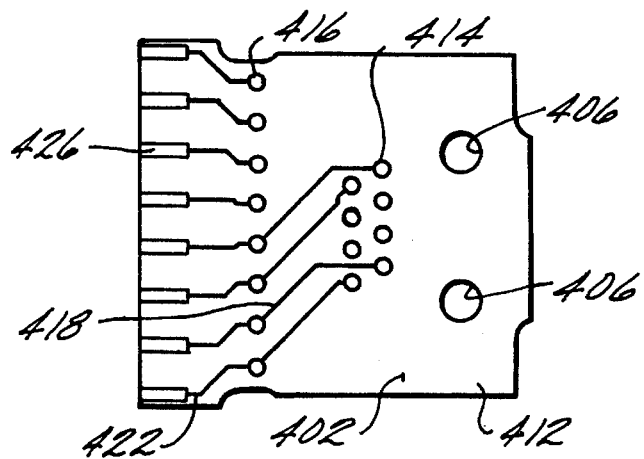
Figure 16D:
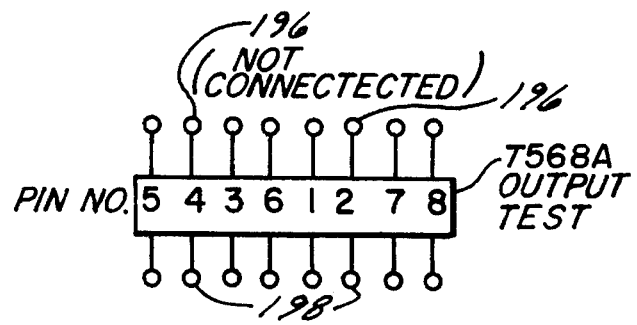
Figure 16A:
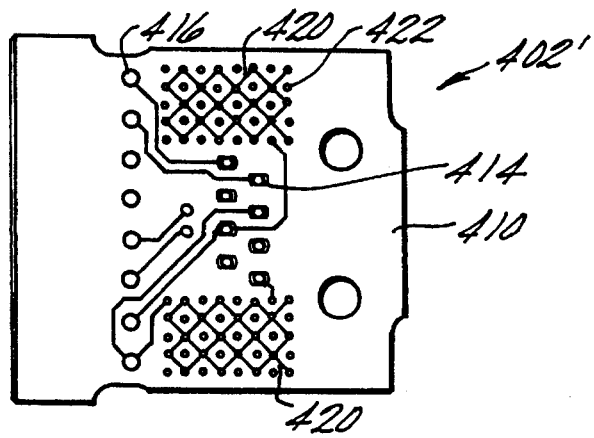
Figure 16B:
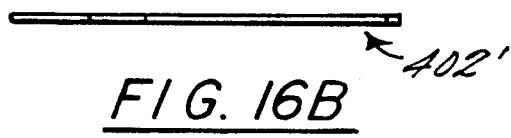
Figure 16C:
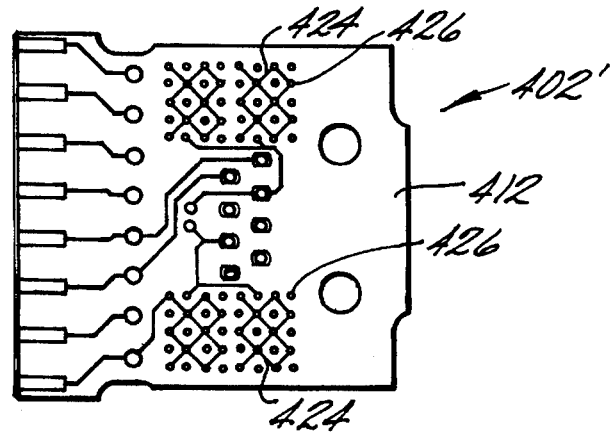
Figure 17D:
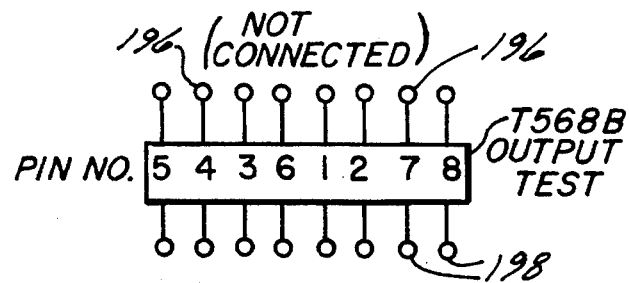
Figure 17A:
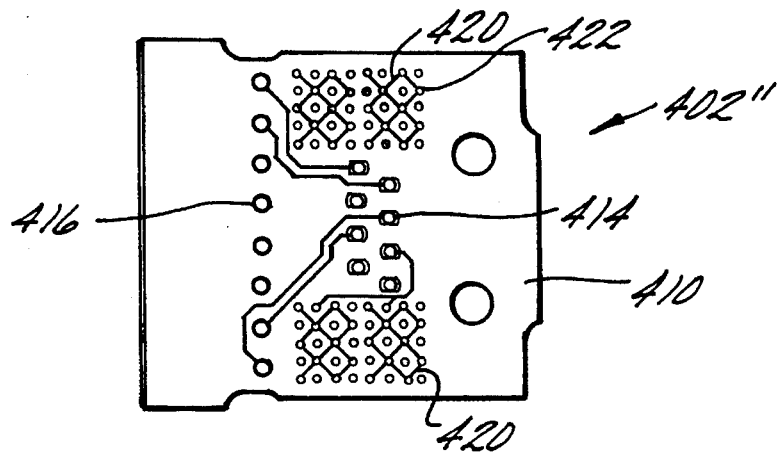
Figure 17B:
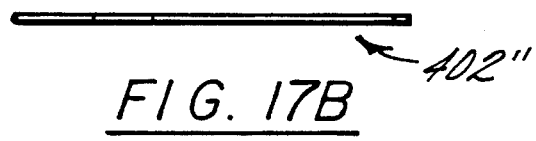
Figure 17C:
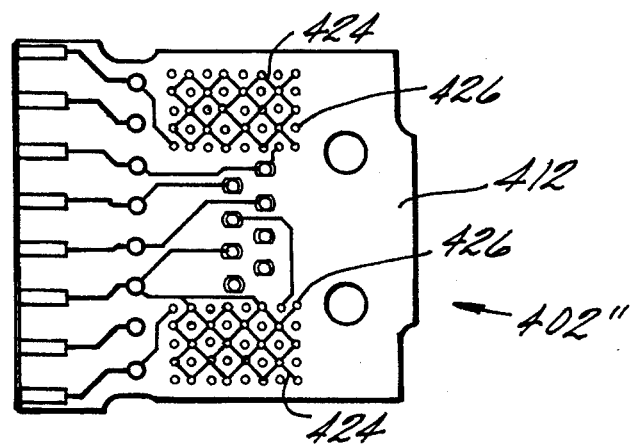
Figure 18D:
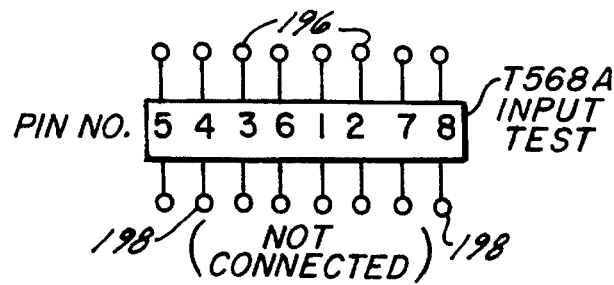
Figure 18A:
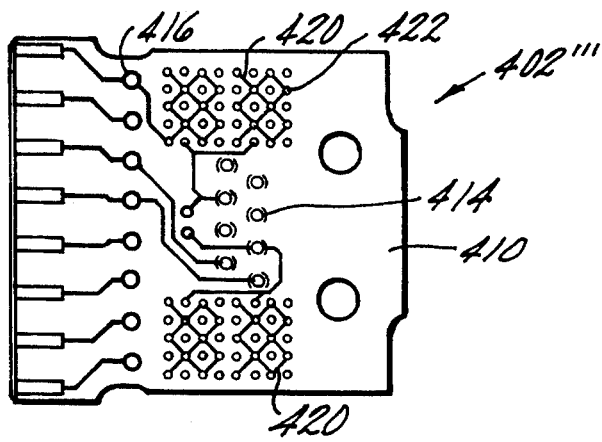
Figure 18B:
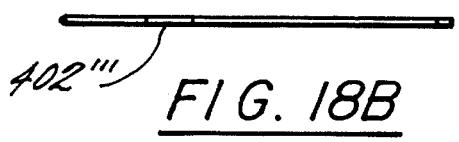
Figure 18C:
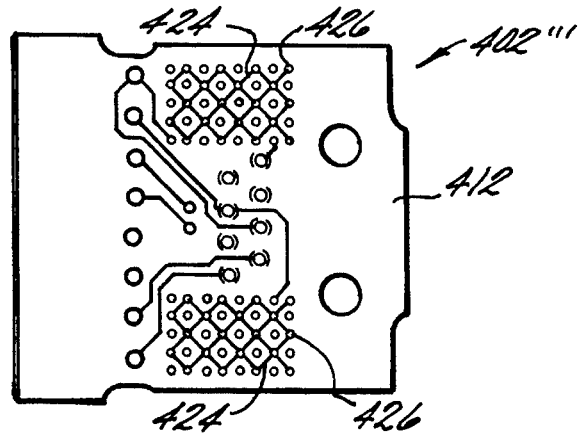
Figure 19D:
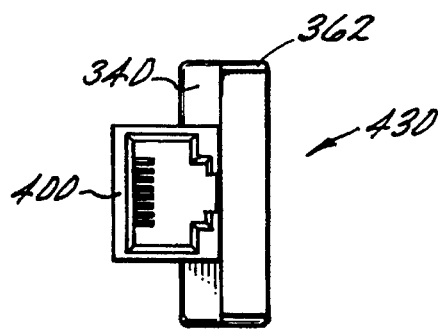
Figure 19A:
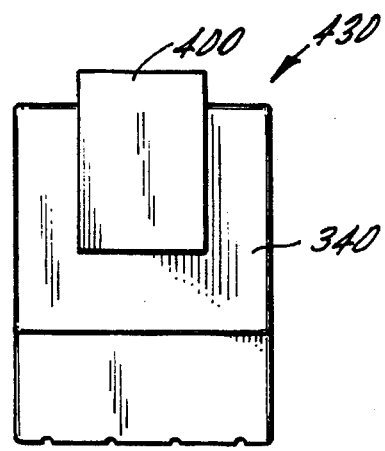
Figure 19B:
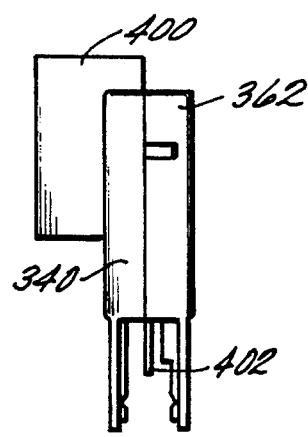
Figure 19C:
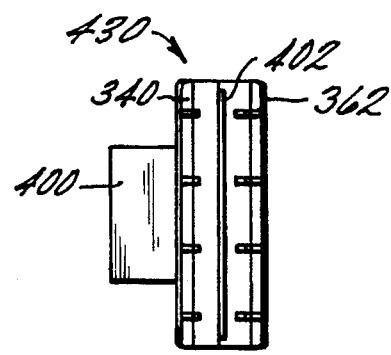
Figure 20D:
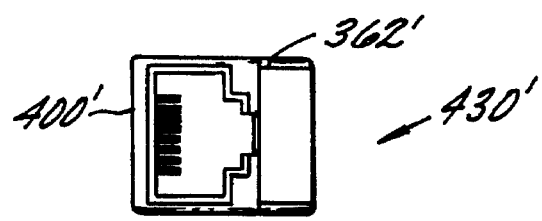
Figure 20A:
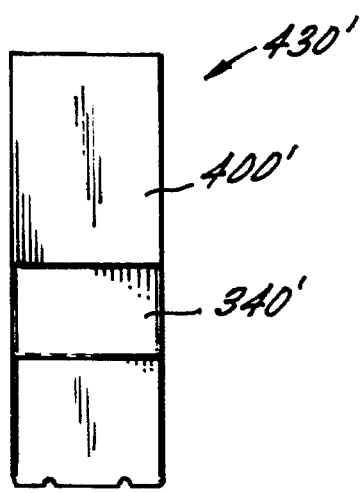
Figure 20B:
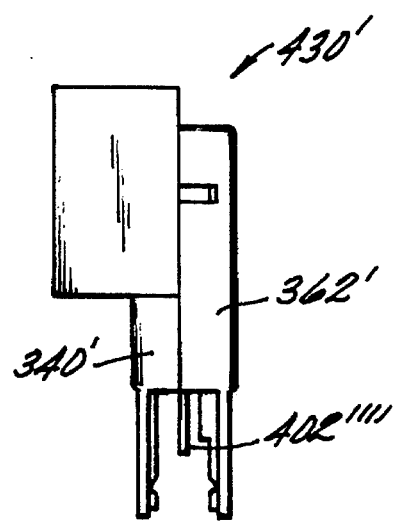
Figure 20C:
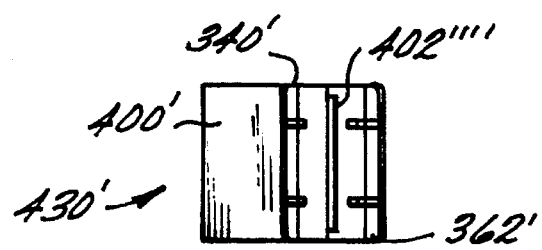
Figure 23C:
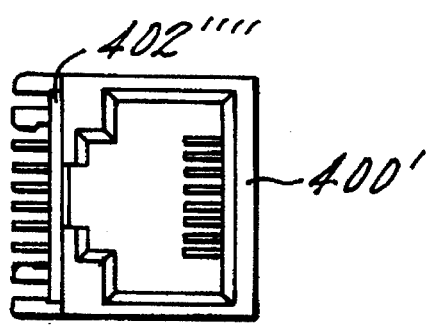
Figure 23B:
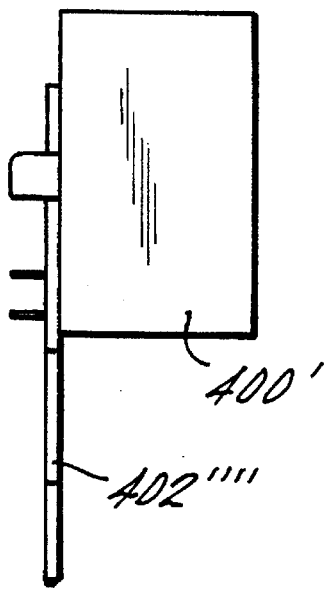
Figure 23A:
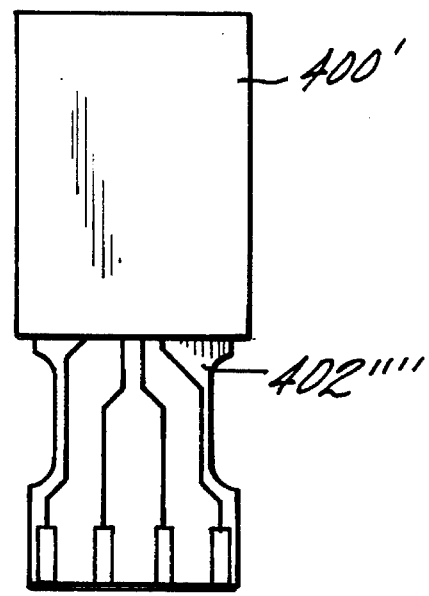
Figure 24D:
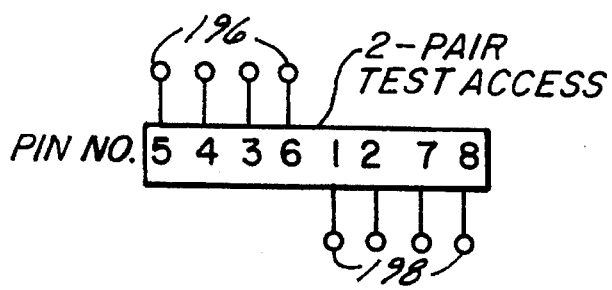
Figure 24E:
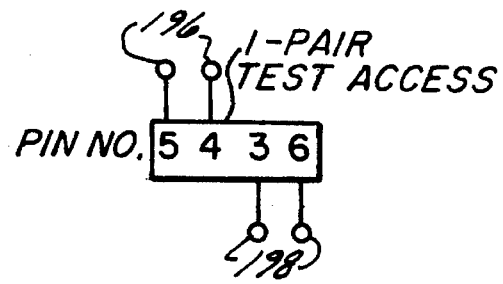
Figure 24A:
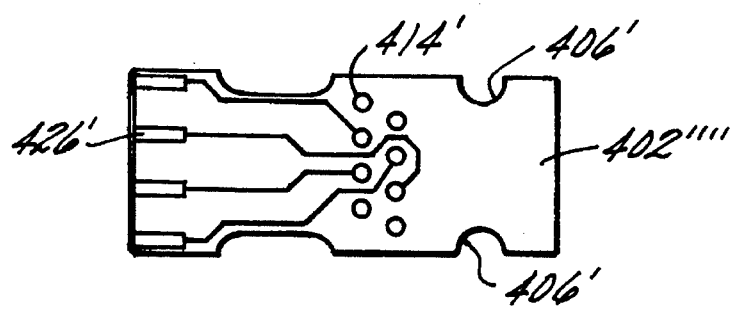
Figure 24B:
Figure 24C:
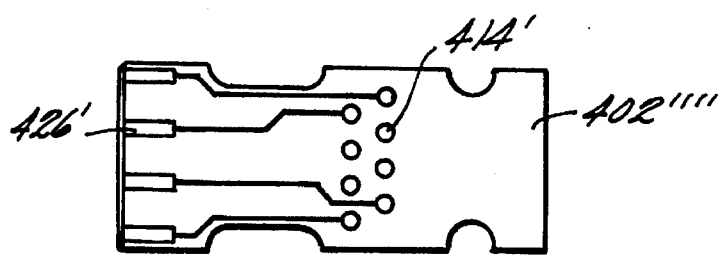

While the above description discloses two rows of connecting blocks with one row of connecting strips therebetween, any number of combination thereof may be employed without departing from the spirit of the present invention. By way of example, FIGS. 10A–C show an embodiment employing two of the assemblies shown in FIGS. 9A–D designated here as 310 and 312. In this embodiment a base 314 may be the same as base 102 shown in FIGS. 3A–B of U.S. Ser. No. 07/934,923.

Referring to FIGS. 11A–E, a disconnect plug for separating or blocking selected positions of a connecting strip 114 is shown generally at 316. Plug 316 shown in these FIGURES will plug four positions, it will be appreciated that a plug can be configured to plug any number of positions or multiple plugs can be used. Plug 316 comprises an inverted U-shaped member 318 having legs 320, 322 and connecting member 324. A pair of opposing spaced apart ribs 326 extend vertically along the interior surface 328, 330 of legs 320, 322 respectively.

Each rib 326 includes a V-shaped notch 332 for engaging surfaces 274, 276, 280 and 282 within slots 270 and 278 of housing 242. Further, ribs 326 are received within slots 270 and 278, thereby aligning plug 316 over the desired positions on the connecting strips. Plug 316 further includes a divider member 334 comprised of an insulating material. Plug 316 is preferably a single molded plastic piece. When plug 316 is installed member 334 is inserted between opposing contacts thereby breaking the electrical connection. Member 334 depends downwardly from member 324 between legs 320 and 322. A plurality of braces 336 are provided between members 334 and 324 to support member 334 during insertion. A T-shaped grip 338 depends upwardly from a surface 340 of member 324.

During insertion of plug 316 on connecting strip 114 the ribs 326 slid into slots 270 and 278. The end of ribs 326 engage rams 274, 280 urging legs 320, 322 outwardly. A continued downward force is applied until the protrusions defined by surfaces 274, 276 and the protrusions defined by surface 280, 282 are received in recesses 332, at which point legs 320 and 322 will snap back inwardly. During this insertion, member 334 is urged between opposing contacts 284 with openings 256, whereby the contacts flex outwardly.

Referring to FIGS. 12A–D and 13A–E, a connecting strip cover for use with a modular jack assembly (described hereinafter) is shown. The cover comprises two mating assemblies. A first assembly 340 (FIGS. 12A–D) comprises an upper body portion 342 having a U-shape defined by legs 344, 346 and a connecting member 348. A leg portion 350 extends downwardly from member 348. Body portion 342 includes a U-shaped cavity 352 at a surface 354 of portion 342. Alignment pins 356 extend outwardly from surface 354. Leg portion 350 has a plurality of spaced apart ribs 356 extending vertically along a surface 358 of portion 350. Each rib 356 includes a V-shaped notch 360 for engaging surfaces 280 and 282 within slots 278. Further, ribs 356 are received slots 278, thereby aligning assembly 340 relative to desired positions on the connecting strip. A second assembly 362 (FIGS. 13A–E) comprises a rectangular shaped body portion 364 having an outer surface 366, a recessed inner surface 368, and a peripheral raised inner surface 370. Alignment holes 372 are positions in surface 370 and are receptive to pins 356 of assembly 340. A leg portion 374 extends downwardly from portion 364. Leg portion 374 has a plurality of spaced apart ribs 376 extending vertically along a surface 378 of portion 374. Each rib 376 includes an inward step 380 for mating with surface 272 in slots 270 and a V-shaped notch 382 for engaging surfaces 274, 276 in slots 270. Further, ribs 376 are received in slots 270, thereby aligning assembly 362 relative to desired positions on the connecting strip. A locking member 384 having ramped surfaces 386 extends away from surface 368.

Referring to FIGS. 14A–C and 15A–D a modular jack 400 is mounted on a circuit board 402. Jack 400 is secured to circuit board 400 by resilient members 404 which are urged into openings 406 of board 402. Further jack 400 includes leads 408 which further secure jack 400 to board 402 and also provide electrical connection thereto. Jack 400 is, for example, commercially available from Steward Stamping, AMP Incorporated and other manufacturers of modular connectors.

Board 402 includes sides 410 and 412. A first set of plated feed through holes 414 with pads have leads 408 soldered or press-fit therein. A second set of plated feed through holes 416 are provided in board 402. Circuit traces 418 on side 412 and circuit traces 420 on side 410 interconnect holes 414 with holes 416. Circuit traces 422 on side 412 and circuit traces 424 on side 410 interconnect holes 416 with a row of edge contact pads 426 on each corresponding side of the circuit board.

Referring to FIGS. 16A–D, 17A–D and 18A–D alternate embodiments of circuit board 402 are shown. Circuit boards 402' (FIGS. 16A–C), 402" (FIG. 17A–C) and 402'" (FIGS. 18 A–C) are similar to board 402 with the exception of the actual circuit pattern, the use of edge contact pads on only one side of the circuit board, and the addition of integrally defined capacitive elements to compensate for reactive imbalance of the jack and the edge contacts. These capacitive elements are of the same type described in U.S. Ser. No. 07/993,480 which is assigned to the assignee hereof and is incorporated herein by reference.

By way of example, side 410 of printed circuit board (401', 402", 402'") includes a grid of circuitry 420 connecting to pads 422, having vias or through holes that are interconnected in substantially diagonal patterns which, in turn, are selectively, connected to circuit traces in such a way as to introduce shunt (parallel) connections to the individual circuit paths provided between pads 414 and pads 416; each of which function as one side of a capacitive element. Likewise, a second side 412 of printed circuit board (402', 402", 402'") includes a grid of circuitry 424 connecting to pads 426, having vias or through holes that are also interconnected in substantially diagonal patterns which, in turn, are selectively connected to other circuit traces; each of which function as a second side of a capacitive element. It will be appreciated that the first set of interconnected of pads 422 on side 410 of the circuit board and the second set of interconnected of pads 426 on side 412 of the circuit board are not electrically connected, by that they are spatially arranged on each side of the circuit board in such a way as to generate a desired amount of capacitive coupling between the circuit grids on opposing sides 412, 210 with the circuit board material being the dielectric material of the capacitor.

Again, the advantage of using through holes, as opposed to discrete capacitors or capacitive pads to perform the turning function that is necessary to achieve a desired level of transmission performance are manifold. Because they require no added components or secondary assembly operations, as to discrete capacitors, the capacitive through holes offer inherent advantages with respect to manufacturing cost as well as product reliability. Also, for circuit boards with the thickness needed to allow mounting of standard, off-the-shelf components, the magnitude of capacitive pads on opposing surfaces. This benefit results from the fact that the capacitive coupling for through holes occurs on multiple planes rather than the unidirectional coupling that is characteristic of parallel pads or plates.

It will be appreciated that in an alternate embodiment (not shown), the diameter and spacing of the through holes may change as required by the physical and electrical constraints of the application or industry standard. Also, the pattern and width of the circuitry that forms the grids and the pads may vary according to the requirements of the individual outlet or connector. Thus providing a method of achieving a controlled amount of capacitive coupling between selected circuit paths of a connector which allows reactive imbalance between pairs that is caused by certain outlet wiring schemes and wire connectors to be compensated for, by the printed circuitry and through holes so as to allow a connection device to meet or exceed Category 5 requirements as described hereinbefore.

Referring to FIGS. 19A–D, jack 400 with circuit board 402 is installed within the cover assembly 340 (FIGS. 12A–D) and assembly 362 (FIGS. 13A– E) form a modular jack test assembly 430. Jack 400 is received within the opening of the U-shape body 342 of assembly 340. Members 404 of jack 400 are engaged by member 384 of assembly 340. Assemblies 340 and 362 are connected by inserting pins 357 of assembly 340 into holes 372 of assembly 362, and may be retained therein by a friction fit or a suitable epoxy. Ribs 356 and 376 are engaged slots 270 and 278 respectfully, in the same manner ribs 326 are engaged in the slots, described hereinbefore. When modular jack test assembly 430 is inserted into a connecting strip 114 pads 426 engage contacts 284 thereby providing electrical contact therebetween. Assembly 430 may be used for testing or at other times when a modular jack connection is desired.

It will be appreciated that the modular jack test assembly may be configured for any number of positions on a connecting strip 114. Assembly 430 shows contact for eight positions. By way of example a four position modular jack test assembly is shown in FIGS. 20A–D, 21A–E, 22A–E, 23A–C and 24A–E. These FIGURES are numbered in accordance with the above described embodiment with the addition of a prime, reference being made thereto for a description thereof. The following differences will be noted; holes 416 are not included, the traces connect directly between pads 414' and 426', upper body portion 342' is rectangularly shaped and has a rectangularly shaped cavity 352', and jack 400' is disposed above body portion 342'.

All housings, brackets and other components herein with the exception of the circuit boards and the electrical contacts is comprised of a suitable insulative material (preferably polycarbonate).

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. An electrically balanced wiring device having transmission lines connected thereto, comprising:

a circuit board having circuitry thereon, said circuit board having first and second opposing surfaces, opposing sides, and opposing ends;

first and second rows of first connector means disposed on said circuit board, said first connector means including,
(1) a housing having opposed upper and lower ends,
(2) a plurality of contacts in said housing extending between said upper and lower ends, each of said contacts including means for connecting to a conductor of a transmission line at first end thereof and means for connecting to said circuit board at a second end thereof, a third row of second connector means disposed on said circuit board, said second connector means including,
(1) a housing having opposed upper and lower ends,
(2) a plurality of first and second contacts in said housing extending between said upper and lower ends, each of said first and second contacts including contact means at a first end thereof and means for connecting to said circuit board at a second end thereof; and wherein, said contacts of said first connector means in said first row are connected by said circuitry on said circuit board to corresponding said first contacts of said second connector means, said contacts of said first connector means in said second row are connected by said circuitry on said circuit board to corresponding said second contacts of said second connector means, said first and second contacts of said second connector means cooperming to define a defeatable electrical connection between corresponding contacts of said first connector means in said first and second rows, said circuitry on said circuit board being configured to substantially restore electrical balance to the transmission lines wherein cross talk originating from said first and second connector means is reduced.

2. The device of claim 1 wherein said circuitry includes:

a plurality of plated through holes being spaced and connected to obtain a desired capacitance for substantially restoring electrical balance to the transmission lines wherein cross talk originating from said first and second connector means is reduced.

3. The device of claim 1 wherein said circuit board is comprised of a dielectric material.

4. The device of claim 1 wherein:

said contacts of said first connector means comprise insulation penetrating beam contacts.

5. The device of claim 4 wherein:

said means for connecting a conductor of a transmission line comprises a pair of beams extending toward said first end of said beam contact.

6. The device of claim 1 wherein:

said means for connecting to said circuit board of said contacts of said first and second connector means comprises a solder tail.

7. The device of claim 1 wherein:

said means for connecting to said circuit board of said contacts of said first and second connect means comprises a solderless tail.

8. The device of claim 1 wherein:

said first and second contacts of said second connector means each including a resilient arm extending toward said first end thereof.

9. The device of claim 1 further comprising:

a base having opposing upper and lower surfaces, said circuit board disposed on said base, said base including mounting means.

10. The device of claim 9 further comprising:

a bracket having opposing upper and lower surfaces, opposing sides, and opposing ends, said lower surface of said bracket attached to said based by first snap lock mounting means, said circuit board attached to said upper surface of said bracket by second snap lock mounting means.

11. The device of claim 10 wherein said first snap lock mounting means comprises:

said bracket further including,
(1) a rail along the length of said lower surface,
(2) a plurality of spaced post depending from a surface of said rail, and
(3) a pair of resilient arms extending outwardly and upwardly from one end of said post at opposing sides thereof; and said base further including,
(1) at least one corresponding longitudinal channel in said upper surface thereof, wherein said rail of said bracket is received,
(2) a plurality of spaced holes through said upper and lower surfaces of said base within said channel, and
(3) an opposing pair of retaining edges defined within each of said spaced holes, one end of each of said arms engaging said corresponding retaining edge within said spaced holes.

12. The device of claim 10 wherein said second snap lock mounting means comprises:

said bracket further including,
a plurality of resilient upwardly extending panels disposed at said sides of said bracket,
a plurality of rails extending upwardly from said upper surface of said bracket, said rails defining channels therebetween, said rails having upper surfaces collectively defining an upper support surface, and
a retaining ledge extending from each of said panels, wherein said retaining ledges engage said first surface of said circuit board with said second surface of said circuit board being supported by said support surface.

13. The device of claim 12 wherein:

said bracket further includes a plurality of side retaining members disposed in between said panels; and said circuit board further includes a plurality of recesses in said sides thereof, said recesses receiving said side retaining members.

14. The device of claim 1 wherein said circuit board further comprises:

a first row of plated through holes for receiving said contacts of said first row of said first connector means;

a second row of plated through holes for receiving said first contacts of said second connector means;

a third row of plated through holes for receiving said second contacts of said second connector means, said third row of plated through holes being adjacent said second row of plated through holes;

a fourth row of plated through holes for receiving said contacts of said second row of said first connector means, said second and third rows of plated through holes being disposed between said first and fourth rows of plated through holes;

wherein said circuitry connects said first and fourth through holes to said third through holes;

a fifth row of plated through holes adjacent to said first row of plated through holes;

wherein said circuitry connects said fifth through holes to selected said first through holes, wherein coupling between said first and fifth through holes offsets electrical imbalance induced by said second connector means connected to said second row of through holes;

a sixth row of plated through hole pairs adjacent to said second row of plated through holes;

wherein said circuitry connects said sixth through holes to selected said second through holes, wherein coupling between said second and sixth through holes offsets electrical imbalance induced by said first connector means connected to said first row of through holes;

a seventh row of plated through hole pairs adjacent to said third row of plated through holes;

wherein said circuitry connects said seventh through holes to selected third through holes, wherein coupling between said third and seventh through holes offsets electrical imbalance induced by said first connector means connected to said fourth row of through holes;

an eighth row of plated through holes adjacent to said fourth row of plated through holes; and wherein said circuitry connects said eighth through holes to selected fourth through holes, wherein coupling between said fourth and eighth through holes offsets electrical imbalance induced by said second connector means connected to said third row of through holes.

\* \* \* \* \*

UNITED STATES PATENT AND TRADEMARK OFFICE
CERTIFICATE OF CORRECTION

PATENT NO.    : 5,459,643
DATED         : October 17, 1995
INVENTOR(S)   : John Siemon et al.

It is certified that error appears in the above-identified patent and that said Letters Patent is hereby corrected as shown below:

Title page,
Item [57], ABSTRACT,
Line 14, delete "connectors" and insert therefor -- means --

Column 3,
Line 61, after "as", delete "the by" and insert therefor -- by the --

Column 4,
Line 17, after "assembly" delete "employees" and insert therefor -- employs --
Line 23, after "elements" insert -- which --

Column 5,
Line 5, after "to" (first occurrence), delete "present" and insert therefor -- prevent --

Column 7,
Line 46, after "thereof;", delete "and"
Line 52, after "adapter", delete "." (period) and insert therefor -- ; -- (semicolon)

Column 11,
Line 19, after "For", delete "instances" and insert therefor -- instance --
Line 27, after "performance", delete "are" and insert therefor -- is --

Column 12,
Line 4, after "shown", delete "is" and insert therefor -- in --
Line 38, after "portion", delete "tappers" and insert therefor -- tapers --
Line 45, delete "tappered" and insert therefor -- tapered --

Column 13,
Line 12, after "having", delete "tappered" and insert therefor -- tapered --
Line 55, after "number", delete "of" and insert thereof -- or --

Column 14,
Line 12, after "installed", insert -- , -- (comma)
Line 20, after "326", delete "slid" and insert therefor -- slide --
Line 41, after "received", insert -- in --
Line 59, after "board", delete "400" and insert therefor -- 402 --

UNITED STATES PATENT AND TRADEMARK OFFICE
CERTIFICATE OF CORRECTION

PATENT NO.     : 5,459,643
DATED          : October 17, 1995
INVENTOR(S)    : John Siemon et al.

It is certified that error appears in the above-identified patent and that said Letters Patent is hereby corrected as shown below:

Column 15,
Line 19, before "402"", delete "401' " and insert therefor -- 402' --
Line 32, after "interconnected", delete "of"
Line 34, after "interconnected", delete "of"
Line 38, after "412", delete "210" and insert therefor -- 410 --
Line 42, before "function", delete "turning" and insert therefor -- tuning --
Line 45, after "as", delete "to" and insert therefor -- do --

Column 16,
Line 9, after "engaged" insert -- in --
Line 52, after "at" insert -- a --

Column 17,
Line 5, after "means", delete "cooperming" and insert therefor -- cooperating --
Line 51, after "said" (second occurrence), delete "based" and insert therefor -- base --

Signed and Sealed this

Sixth Day of August, 2002

Attest:

JAMES E. ROGAN
*Attesting Officer*  *Director of the United States Patent and Trademark Office*